(12) United States Patent
Takagiwa

(10) Patent No.: US 10,891,987 B2
(45) Date of Patent: Jan. 12, 2021

(54) SEMICONDUCTOR MEMORY DEVICE

(71) Applicant: TOSHIBA MEMORY CORPORATION, Tokyo (JP)

(72) Inventor: Teruo Takagiwa, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/537,666

(22) Filed: Aug. 12, 2019

(65) Prior Publication Data

US 2020/0286529 A1    Sep. 10, 2020

(30) Foreign Application Priority Data

Mar. 8, 2019    (JP) .................................. 2019-042720

(51) Int. Cl.
| | |
|---|---|
| *G11C 5/06* | (2006.01) |
| *H01L 27/11582* | (2017.01) |
| *H01L 27/11556* | (2017.01) |
| *G11C 16/26* | (2006.01) |
| *G11C 7/18* | (2006.01) |

(52) U.S. Cl.
CPC .................. *G11C 5/06* (2013.01); *G11C 7/18* (2013.01); *G11C 16/26* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| | | | | |
|---|---|---|---|---|
| 9,824,736 B1 * | 11/2017 | Katayama | ........... | G11C 11/1673 |
| 10,037,813 B2 | 7/2018 | Maejima et al. | | |
| 10,056,150 B2 * | 8/2018 | Ikeda | ................. | H01L 27/11524 |
| 2001/0052599 A1 * | 12/2001 | Ooishi | ................. | G11C 29/848 |
| | | | | 257/63 |
| 2002/0172070 A1 * | 11/2002 | Arimoto | ................... | G11C 8/14 |
| | | | | 365/149 |
| 2011/0176347 A1 * | 7/2011 | Hisada | ............... | H01L 27/11526 |
| | | | | 365/72 |
| 2013/0194867 A1 * | 8/2013 | Fukuda | ............. | H01L 27/11582 |
| | | | | 365/185.08 |
| 2017/0309339 A1 * | 10/2017 | Hsiung | .................. | G11C 16/10 |
| 2019/0057746 A1 | 2/2019 | Komai | | |

FOREIGN PATENT DOCUMENTS

JP    2017142874 A    8/2017

* cited by examiner

*Primary Examiner* — Tan T. Nguyen
(74) *Attorney, Agent, or Firm* — Holtz, Holtz & Volek PC

(57) ABSTRACT

According to an embodiment, a semiconductor memory device includes a first memory cell, a first interconnect, a first sense amplifier, a second interconnect, and a first latch circuit. The first interconnect is coupled to the first memory cell and extends in a first direction in a first interconnect layer. The first sense amplifier is coupled to the first interconnect. The second interconnect is coupled to the first sense amplifier and extends in the first direction in the first interconnect layer. The first latch circuit is coupled to the second interconnect. An end surface of the first interconnect on a side facing the first direction is opposed to an end surface of the second interconnect on a side facing a direction opposite to the first direction.

19 Claims, 22 Drawing Sheets

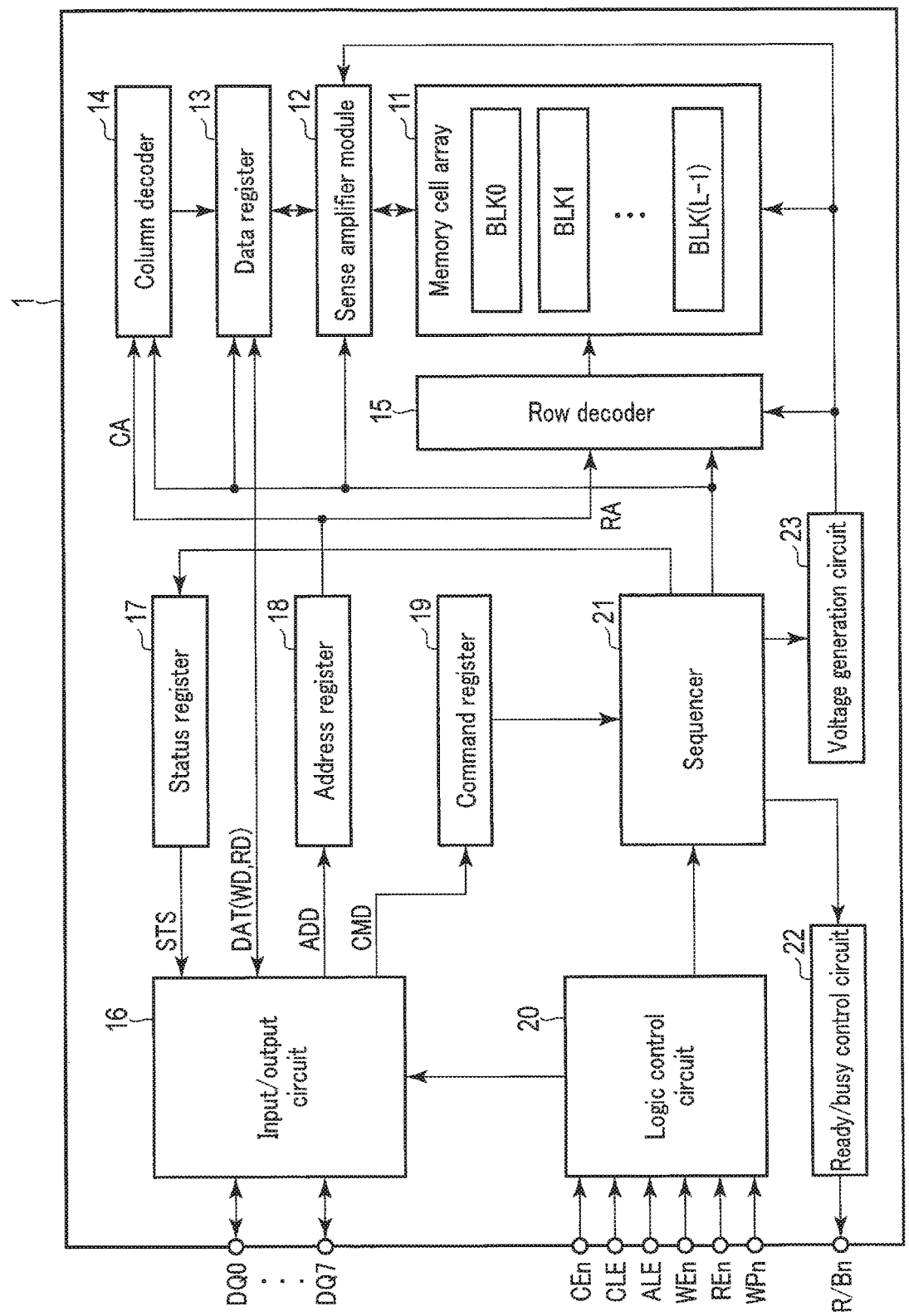
F I G. 2

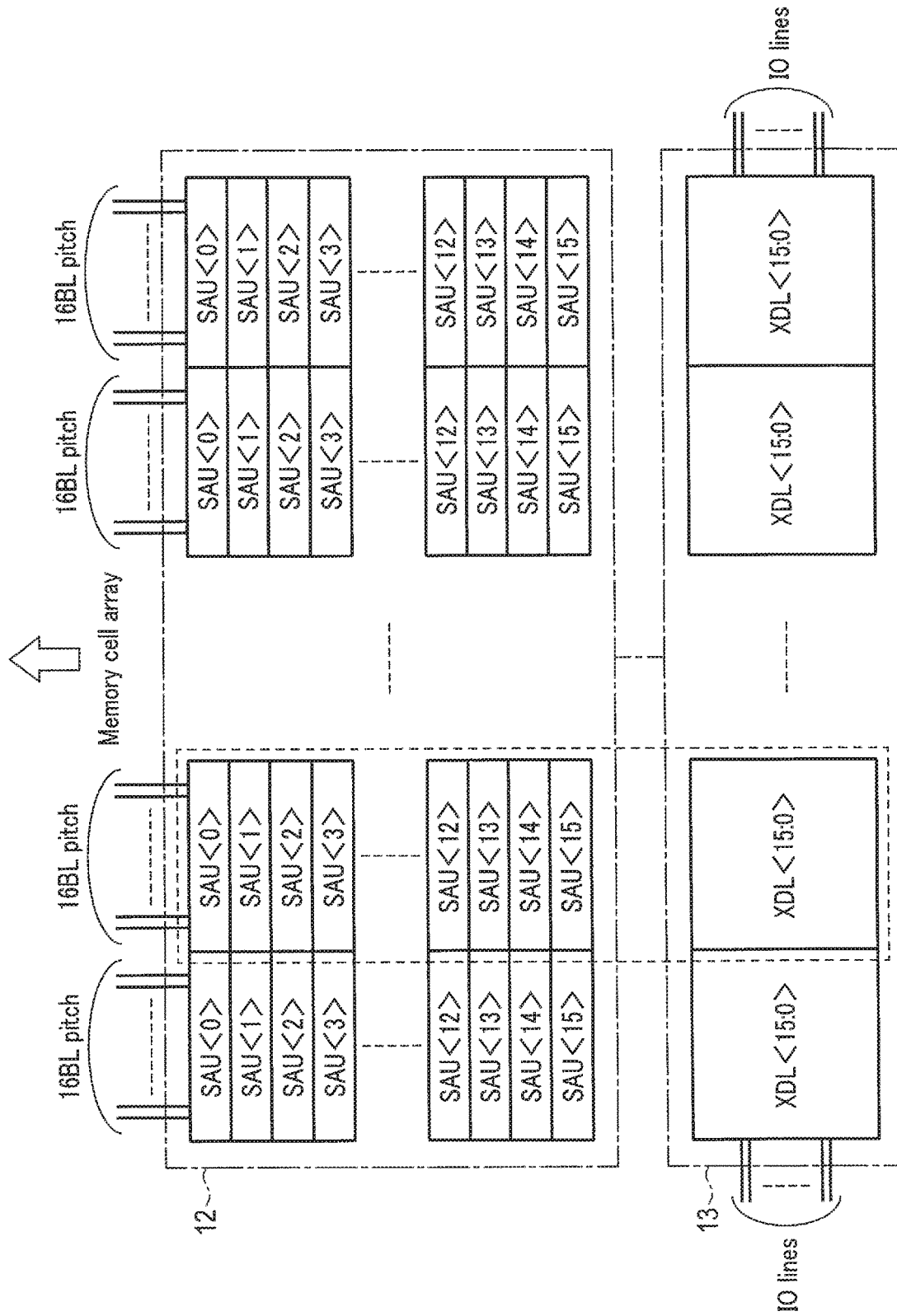
F I G. 5

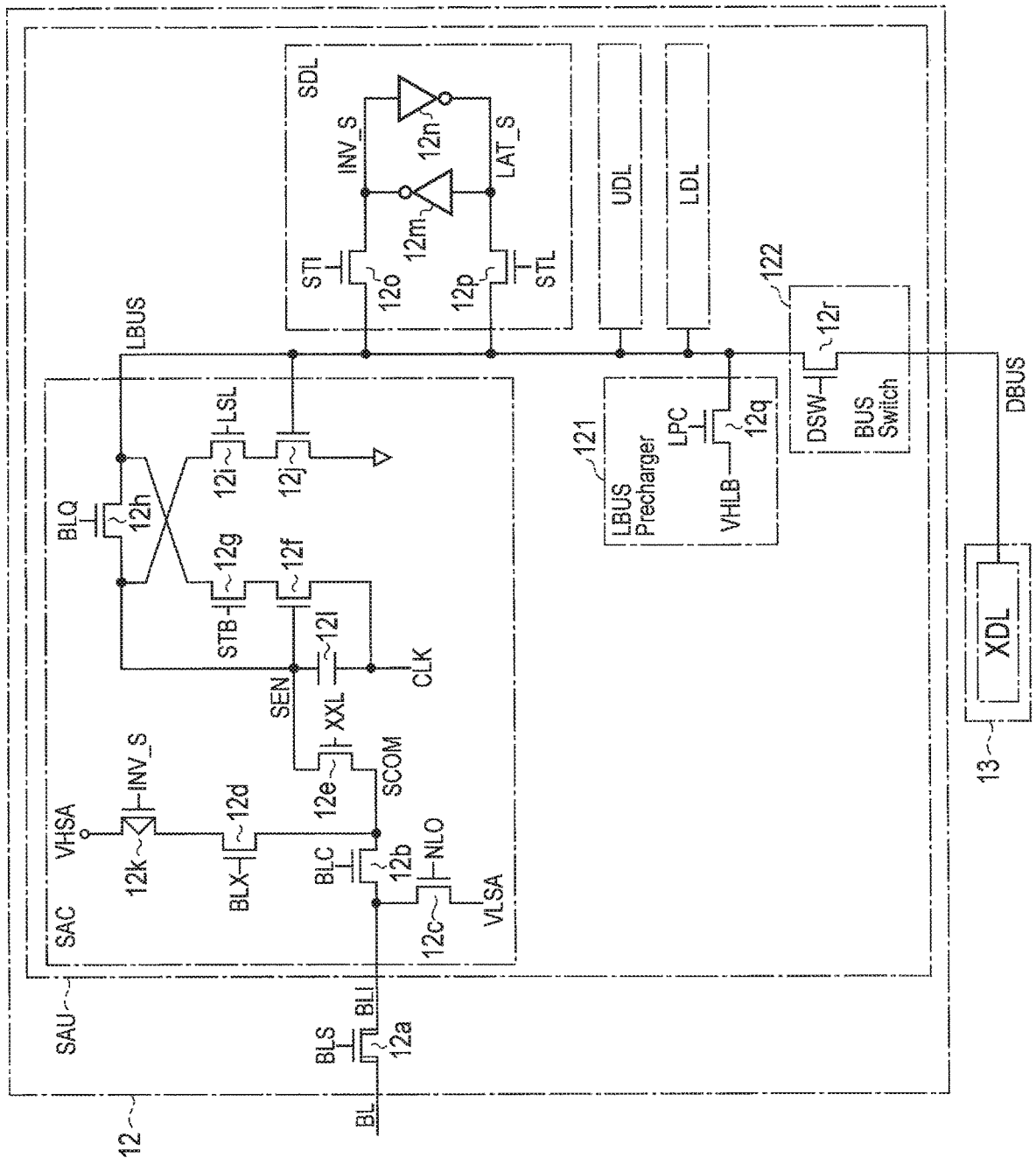
F I G. 6

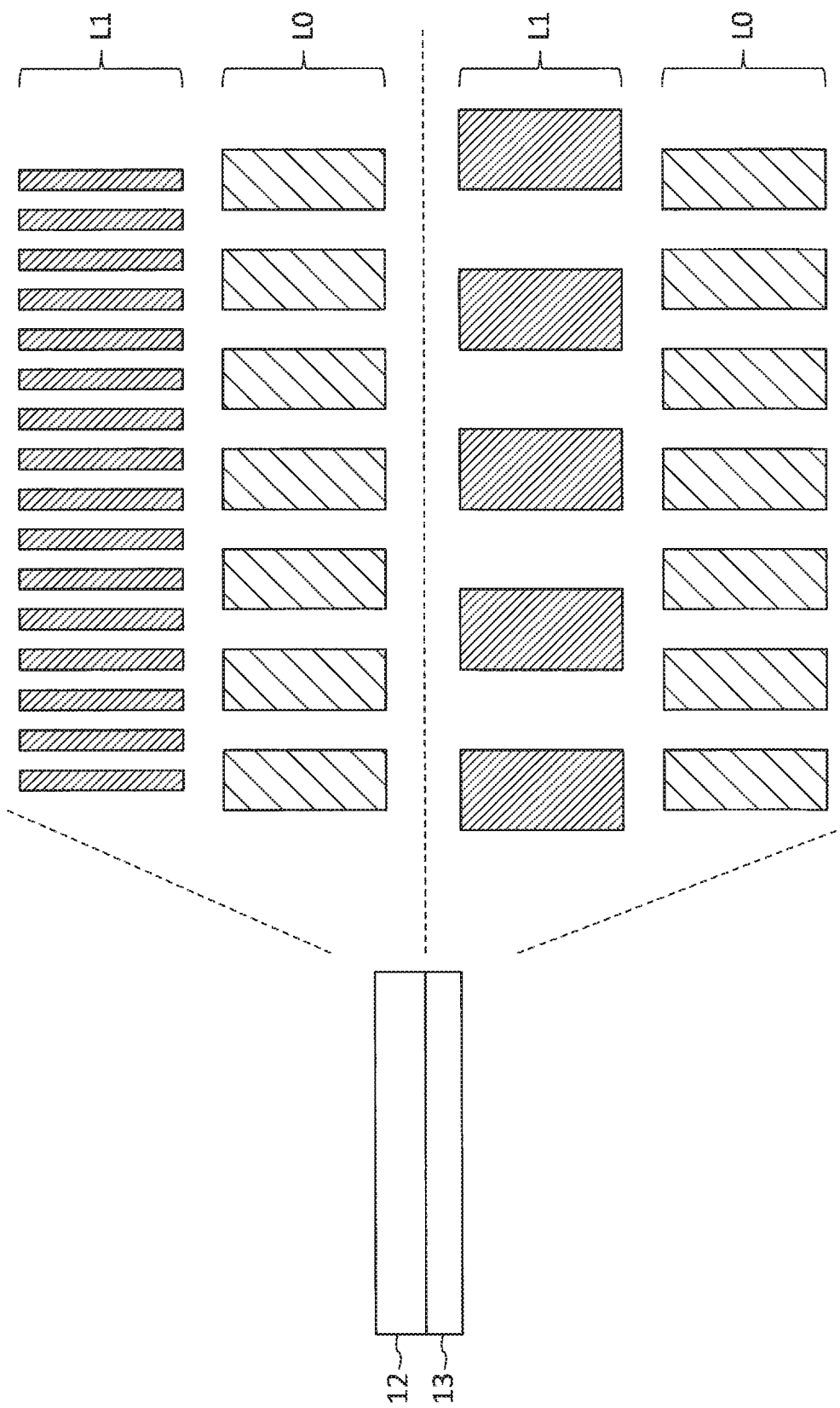
F I G. 12

SEMICONDUCTOR MEMORY DEVICE

CROSS-REFERENCE TO RELATED APPLICATIONS

This application is based upon and claims the benefit of priority from Japanese Patent Application No. 2019-042720, filed Mar. 8, 2019, the entire contents of which are incorporated herein by reference.

FIELD

Embodiments described herein relate generally to a semiconductor memory device.

BACKGROUND

A NAND-type flash memory is known as a semiconductor memory device.

BRIEF DESCRIPTION OF THE DRAWINGS

FIG. 2 is a block diagram illustrating an example of a configuration of the semiconductor memory device according to the first embodiment.

FIG. 5 is a block diagram illustrating an example of a configuration of a sense amplifier module and a data register in the semiconductor memory device according to the first embodiment.

FIG. 6 is a diagram illustrating an example of a part of a circuit configuration of the sense amplifier module in the semiconductor memory device according to the first embodiment.

FIG. 12 is a diagram for comparison between the widths of interconnects in different metal interconnect layers in the semiconductor memory device according to the first embodiment.

DETAILED DESCRIPTION

Generally, according to an embodiment, a semiconductor memory device includes a first memory cell, a first interconnect, a first sense amplifier, a second interconnect, and a first latch circuit. The first interconnect is coupled to the first memory cell and extends in a first direction in a first interconnect layer. The first sense amplifier is coupled to the first interconnect. The second interconnect is coupled to the first sense amplifier and extends in the first direction in the first interconnect layer. The first latch circuit is coupled to the second interconnect. An end surface of the first interconnect on a side facing the first direction is opposed to an end surface of the second interconnect on a side facing a direction opposite to the first direction.

Hereinafter, embodiments will be described with reference to the accompanying drawings. The drawings are schematic. In the description that follows, components having substantially the same functions and configurations will be denoted by the same reference symbols. The numbers after the letters constituting the reference symbols, and the letters after the numbers constituting the reference symbols are used to discriminate between components that are denoted by reference symbols sharing letters or numbers in common and that have similar configurations. If there is no need to discriminate between the components that are denoted by the reference symbols sharing the letters or numbers in common, such components are denoted by reference symbols that include only the letters or numbers that are in common.

First Embodiment

Hereinafter, a semiconductor memory device 1 according to a first embodiment will be described.

Configuration Example (1) Memory System

Figure 1:
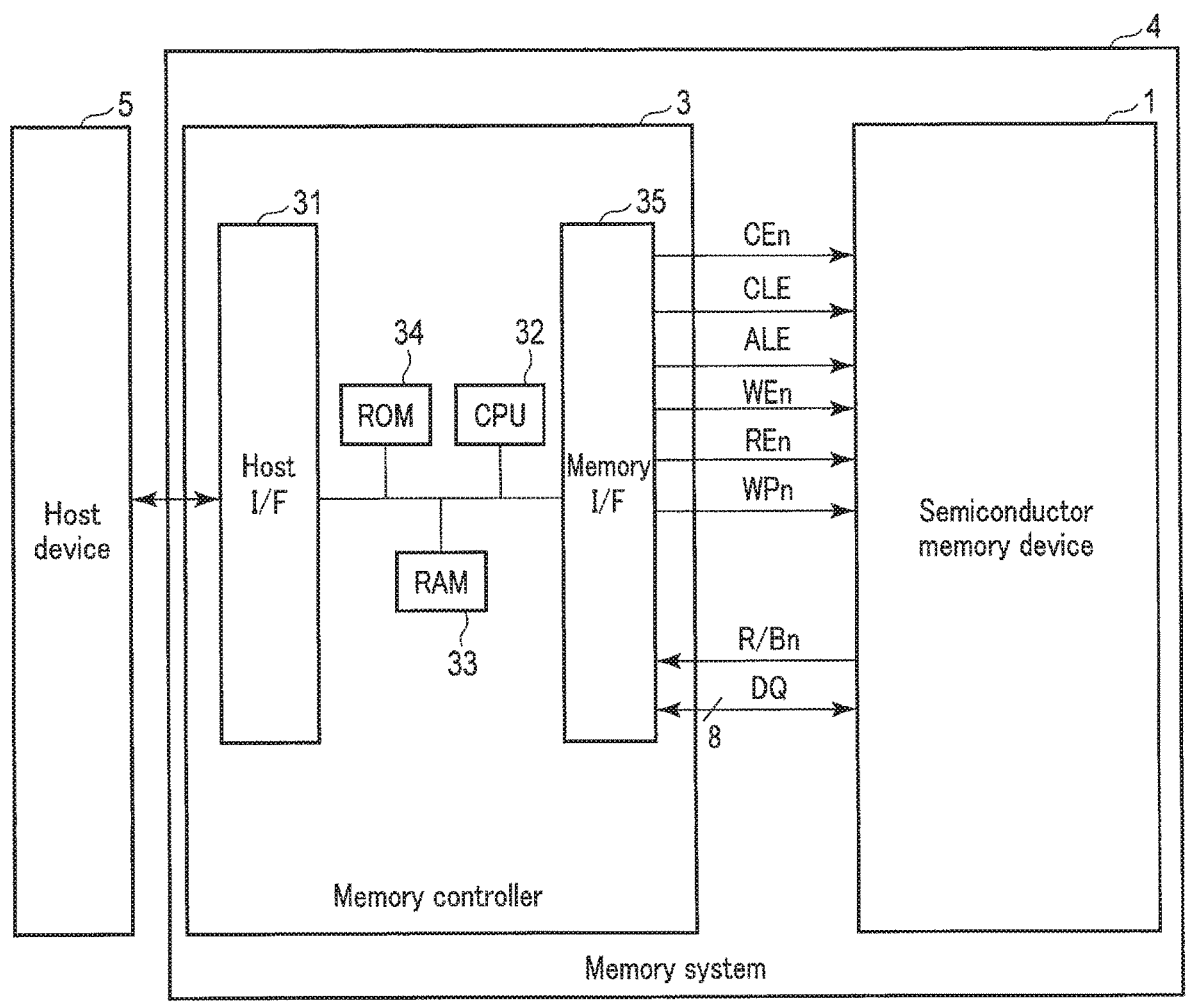
FIG. 1 is a block diagram illustrating an example of a configuration of a memory system including a semiconductor memory device according to a first embodiment.

FIG. 1 is a block diagram illustrating an example of a configuration of a memory system 4 including a semiconductor memory device 1 according to a first embodiment.

As shown in FIG. 1, the memory system 4 includes a memory controller 3, as well as the semiconductor memory device 1, and is controlled by a host device 5. The memory system 4 is, for example, a solid-state drive (SSD), an SD (registered trademark) card, etc.

The semiconductor memory device 1 is controlled by the memory controller 3. The memory controller 3 receives an instruction from the host device 5, and controls the semiconductor memory device 1 based on the received instruction.

The memory controller 3 includes a host interface unit 31, a central processing unit (CPU) 32, a random-access memory (RAM) 33, a read-only memory (ROM) 34, and a memory interface unit 35. The memory controller 3 is configured as, for example, a system on a chip (SoC).

The ROM 34 stores firmware (programs). The RAM 33 is capable of storing the firmware, and is used as a work area of the CPU 32. Furthermore, the RAM 33 temporarily stores data, and functions as a buffer and cache. The firmware stored in the ROM 34 and loaded onto the RAM 33 is executed by the CPU 32. Thereby, the memory controller 3 executes various operations, including read operations and write operations, which will be described later, as well as some functions of the host interface unit 31 and the memory interface unit 35.

The host interface unit 31 is coupled to the host device 5 via a bus, and manages communications between the memory controller 3 and the host device 5. The memory interface unit 35 is coupled to the semiconductor memory device 1, and manages communications between the memory controller 3 and the semiconductor memory device 1.

(2) Configuration of Semiconductor Memory Device

FIG. 2 is a block diagram illustrating an example of a configuration of the semiconductor memory device 1 according to the first embodiment. In FIG. 2, some of the couplings between the blocks are indicated by arrows; however, the couplings between the blocks are not limited to those shown in FIG. 2.

As shown in FIG. 2, the semiconductor memory device 1 includes a memory cell array 11, a sense amplifier module 12, a data register 13, a column decoder 14, a row decoder 15, input and output circuit 16, a status register 17, an address register 18, a command register 19, a logic control circuit 20, a sequencer 21, a ready/busy control circuit 22, and a voltage generation circuit 23.

The memory cell array 11 includes a plurality of blocks BLK (BLK0, BLK1, . . . , and BLK(L−1)) (where "L" is an integer of 2 or greater). Each block BLK includes a plurality of non-volatile memory cells each associated with a bit line and a word line, and constitutes, for example, a unit of data erasure. In the semiconductor memory device 1, various operations are performed, such as a write operation in which write data WD is stored into the memory cell array 11, and a read operation in which read data RD is read from the memory cell array 11, etc.

The input and output circuit 16 controls input and output of signals DQ to and from the memory controller 3. The signals DQ include a command CMD, data DAT, address information ADD, status information STS, etc. The command CMD includes, for example, an instruction to execute an instruction from the host device 5. The data DAT includes write data WD or read data RD. The address information ADD includes, for example, a row address RA and a column address CA. The status information STS includes, for example, information on the status of the semiconductor memory device 1 in a write operation and a read operation.

More specifically, the input and output circuit 16 includes an input circuit and an output circuit, which perform processes that will be described below. The input circuit receives, from the memory controller 3, write data WD, address information ADD, and a command CMD. The input circuit transfers the received write data WD to the data register 13, transfers the received address information ADD to the address register 18, and transfers the received command CMD to the command register 19. On the other hand, the output circuit receives status information STS from the status register 17, and receives the read data RD from the data register 13. The output circuit transmits the received status information STS and the read data RD to the memory controller 3. The input and output circuit 16 and the data register 13 are coupled via a data bus. The data bus includes, for example, eight data lines IO0 to IO7, respectively corresponding to the signals DQ0 to DQ7. The number of data lines IO is not limited to eight, and may be set to, for example, 16 or 32, or any other number.

The status register 17 stores status information STS, and transfers the status information STS to the input and output circuit 16, based on an instruction from the sequencer 21.

The address register 18 stores address information ADD transferred from the input and output circuit 16. The address register 18 transfers the column address CA in the address information ADD to the column decoder 14, and transfers the row address RA in the address information ADD to the row decoder 15.

The command register 19 stores the command CMD transferred from the input and output circuit 16, and transfers the command CMD to the sequencer 21.

The logic control circuit 20 receives, from the memory controller 3, a chip enable signal CEn, a command latch enable signal CLE, an address latch enable signal ALE, a write enable signal WEn, a read enable signal REn, and a write protect signal WPn, for example. The logic control circuit 20 controls the input and output circuit 16 and the sequencer 21, based on the received signals.

The chip enable signal CEn is a signal used to enable the semiconductor memory device 1. The command latch enable signal CLE is a signal used to notify the input and output circuit 16 that the signals DQ0 to DQ7 input to the semiconductor memory device 1 serve as a command CMD. The address latch enable signal ALE is a signal used to notify the input and output circuit 16 that the signals DQ0 to DQ7 input to the semiconductor memory device 1 serve as address information ADD. The write enable signal WEn and the read enable signal REn are signals used to instruct the input and output circuit 16 to respectively input and output, for example, the signals DQ0 to DQ7. The write protect signal WPn is a signal used to instruct the semiconductor memory device 1 to prohibit data from being written or erased.

The sequencer 21 controls the operation of the entire semiconductor memory device 1, based on the command CMD stored in the command register 19. For example, the sequencer 21 controls the sense amplifier module 12, the data register 13, the column decoder 14, the row decoder 15, the voltage generation circuit 23, etc., and performs a write operation, a read operation, etc.

The ready/busy control circuit 22 generates a ready/busy signal R/Bn in accordance with the control by the sequencer 21, and transmits the generated ready/busy signal R/Bn to the memory controller 3. The ready/busy signal R/Bn is a signal used to make a notification as to whether the semiconductor memory device 1 is in a ready state in which the semiconductor memory device 1 is ready to receive an instruction from the memory controller, or in a busy state in which the semiconductor memory device 1 is not ready to receive an instruction.

The voltage generation circuit 23 generates voltages to be used in a write operation, a read operation, etc. based on the control by the sequencer 21, and supplies the generated voltages to the memory cell array 11, the sense amplifier module 12, the row decoder 15, etc. For example, the voltage generation circuit 23 supplies the row decoder 15 with voltages to be applied to word lines WL in operations such as a read operation and a write operation.

The sense amplifier module 12 senses data stored in the memory cell array 11 to generate read data RD, and transfers the generated read data RD to the data register 13. The sense amplifier module 12 receives write data WD from the data register 13, and allows the received write data WD to be stored in the memory cell array 11.

The data register 13 includes a plurality of latch circuits. The latch circuits store write data WD and read data RD. The data register 13 temporarily stores the write data WD received from the input and output circuit 16, and transfers the write data WD to the sense amplifier module 12. The data register 13 temporarily stores the read data RD received from the sense amplifier module 12, and transfers the read data RD to the input and output circuit 16.

In a write operation or a read operation, for example, the column decoder 14 decodes the column address CA received from the address register 18. The column decoder 14 selects a latch circuit in the data register 13 based on the result of decoding.

The row decoder 15 receives the row address RA from the address register 18, and decodes the received row address RA. The row decoder 15 selects a block BLK to be a target of various operations, such as a read operation and a write operation, based on the result of decoding. The row decoder 15 is capable of transferring the voltages supplied from the voltage generation circuit 23 to the selected block BLK.

(3) Memory Cell Array of NAND-Type Flash Memory

Figure 3:
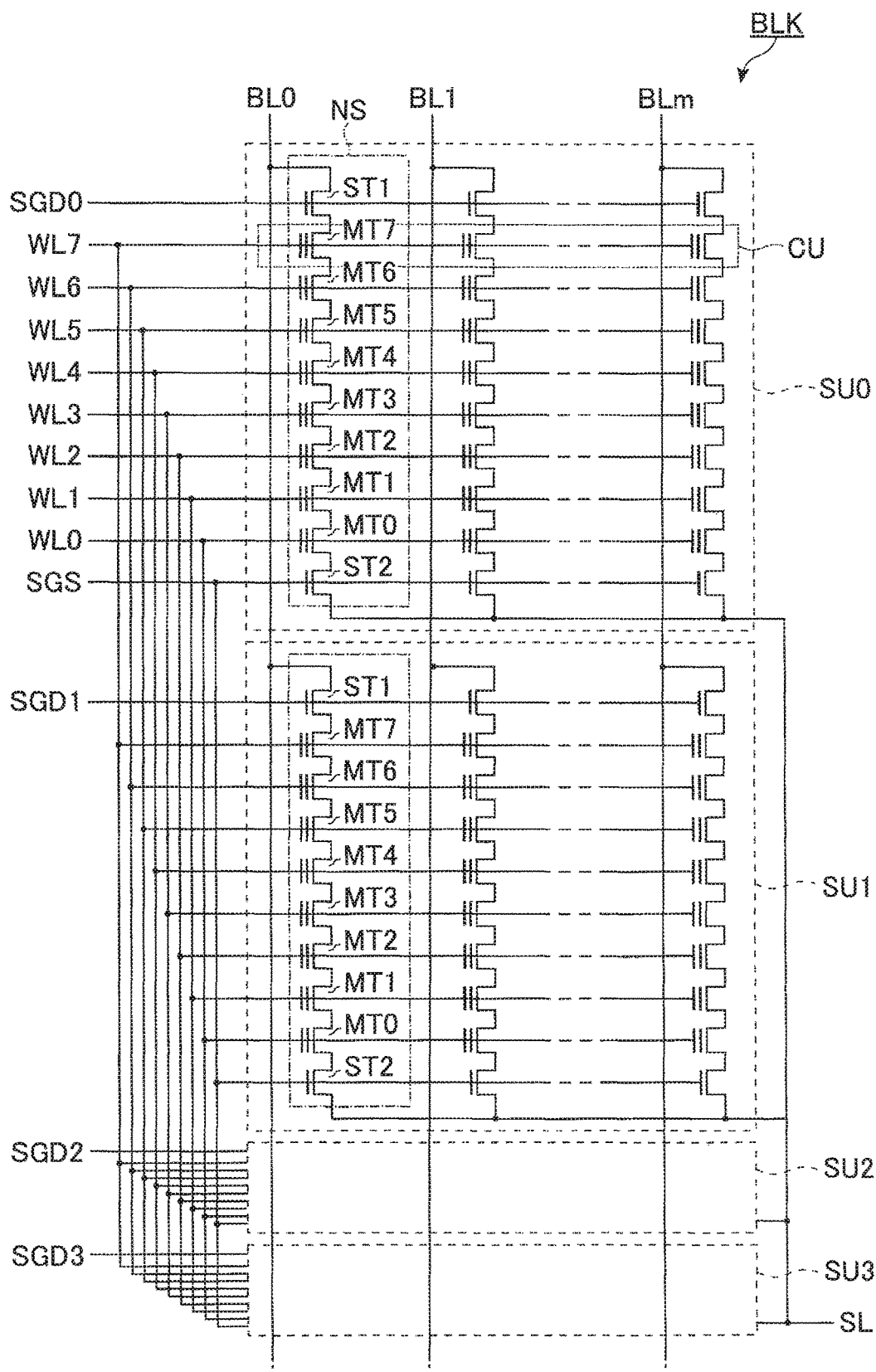
FIG. 3 is a diagram illustrating an example of a circuit configuration of a memory cell array in the semiconductor memory device according to the first embodiment.

FIG. 3 is a diagram illustrating an example of a circuit configuration of one of a plurality of blocks BLK included in the memory cell array 11, as an example of a circuit configuration of the memory cell array 11 shown in FIG. 2. Each of the blocks BLK included in the memory cell array 11 has a circuit configuration shown, for example, in FIG. 3.

As shown in FIG. 3, each block BLK includes, for example, four string units SU0 to SU3. Each of the string units SU includes a plurality of NAND strings NS. Each NAND string NS is coupled to a corresponding bit line BL, of a plurality of bit lines BL0 to BLm (where "m" is an integer of 1 or greater), and includes, for example, memory cell transistors MT0 to MT7 and select transistors ST1 and ST2. Each of the memory cell transistors MT includes a control gate and a charge accumulation layer, and stores data in a non-volatile manner. The select transistors ST1 and ST2 are used in various operations to select the NAND string NS including the select transistors ST1 and ST2.

A drain of the select transistor ST1 of each of the NAND strings NS is coupled to the corresponding bit line BL. The memory cell transistors MT0 to MT7 are coupled in series between a source of the select transistor ST1 and a drain of the select transistor ST2. A source of the select transistor ST2 is coupled to a source line SL.

Gates (control gates) of select transistors ST1 of a plurality of NAND strings NS included in the same string unit SUj are commonly coupled to a select gate line SGDj. In the example of FIG. 3, "j" is an integer of one of 0 to 3. Gates of select transistors ST2 of a plurality of NAND strings NS included in the same block BLK are commonly coupled to a select gate line SGS. The control gates of memory cell transistors MTi of a plurality of NAND strings NS included in the same block BLK are commonly coupled to a word line WLi. In the example of FIG. 3, "i" is an integer of one of 0 to 7.

Each bit line BL is coupled to the drains of select transistors ST1 of the respective NAND strings NS included in a plurality of string units SU. The source line SL is shared among the string units SU.

A group of memory cell transistors MT commonly coupled to a word line WL in a string unit SU is referred to as, for example, a "cell unit CU". Data of bits stored at the same digit position in memory cell transistors MT in a cell unit CU is referred to as, for example, "1-page data".

The circuit configuration of the memory cell array 11 has been described as above; however, the circuit configuration of the memory cell array 11 is not limited thereto. For example, the number of string units SU included in each block BLK may be designed to be any number. Also, the numbers of memory cell transistors MT and select transistors ST1 and ST2 included in each NAND string NS may be designed to be any number. The number of word lines WL and the numbers of select gate lines SGD and SGS may be changed based on the number of memory cell transistors MT and the numbers of select transistors ST1 and ST2 in the NAND string NS.

Figure 4:
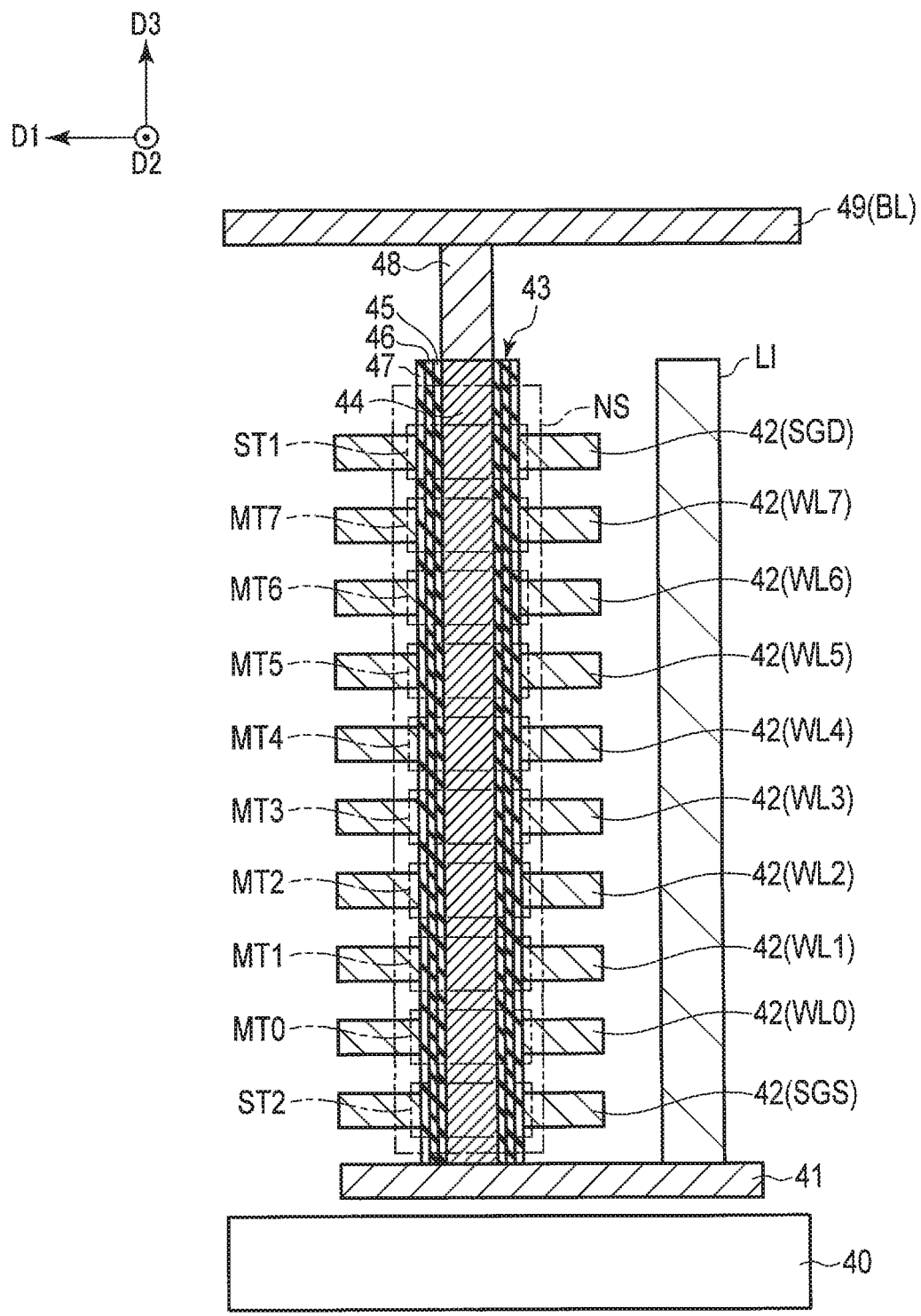
FIG. 4 is a diagram illustrating an example of a part of a cross-sectional structure of the memory cell array in the semiconductor memory device according to the first embodiment.

FIG. 4 is a cross-sectional view illustrating an example of a part of a cross-sectional structure of the memory cell array 11 in the semiconductor memory device 1 according to the first embodiment. In the example of FIG. 4, interlayer insulators are omitted.

Part of the structure of the memory cell array 11 is constituted by conductors 41, 42, and 49, a memory pillar 43, and a contact plug 48.

The semiconductor memory device 1 includes a semiconductor substrate 40. Two directions that are parallel to the surface of the semiconductor substrate 40 and, for example, orthogonal to each other will be defined as a first direction D1 and a second direction D2, and a direction which is, for example, orthogonal to the surface of the semiconductor substrate 40 and in which the memory cell array 11 is formed will be defined as a third direction D3. In the description that follows, the third direction D3 is assumed as upward, and the direction opposite to the third direction D3 is assumed as downward; however, these assumptions are merely for convenience, and are irrelevant to, for example, the direction of gravitational force.

A conductor 41 is provided above the semiconductor substrate 40, with an insulator interposed therebetween. The conductor 41 functions as a source line SL. Ten layered conductors 42 are stacked above the conductor 41, with an insulator interposed between adjacent conductors. The ten layered conductors 42 respectively function as a select gate line SGS, word lines WL0 to WL7, and a select gate line SGD.

A memory pillar 43 is provided in the ten layered conductors 42. The memory pillar 43 extends in, for example, the third direction D3. In the memory pillar 43, a tunnel insulation layer 45, a charge accumulation layer 46, and a block insulation layer 47 are provided in order on a side surface of a pillar-shaped semiconductor 44. A lower end of the semiconductor 44 reaches the conductor 41. A portion of the memory pillar 43 that crosses one of the conductors 42 functions as a memory cell transistor MT, a select transistor ST1, or a select transistor ST2. The semiconductor 44 functions as a current path of a NAND string NS, and serves as a region where a channel of each memory cell transistor MT is formed. An upper end of the semiconductor 44 is connected to the conductor 49 via the contact plug 48. The conductor 49 extends in the first direction D1, and functions as a bit line BL. Also, a conductor LI is provided on the conductor 41. The conductor LI extends along the second direction D2, and functions as a source line contact. The conductor LI has, for example, a line shape extending along the second direction D2. One string unit SU, for example, is provided between two conductors LI.

(4) Sense Amplifier and Data Register

FIG. 5 is a block diagram illustrating an example of a configuration of the sense amplifier module 12 and the data register 13 in the semiconductor memory device 1 according to the first embodiment.

As shown in FIG. 5, the sense amplifier module 12 includes a plurality of sense amplifier units SAU, and the data register 13 includes a plurality of latch circuits XDL.

In the sense amplifier module 12, the sense amplifier units SAU are provided for the respective bit lines BL. For example, 16 sense amplifier units SAU<0> to SAU<15> are respectively provided for 16 bit lines BL. The sense amplifier units SAU sense data in memory cell transistors MT coupled to the corresponding bit lines BL, and allows data to be stored in the memory cell transistors MT.

In the data register 13, the latch circuits XDL are provided for the respective sense amplifier units SAU. For example, 16 latch circuits XDL<0> to XDL<15> are provided for the respective 16 sense amplifier units SAU<0> to SAU<15>, so as to correspond one to one to the sense amplifier units SAU<0> to SAU<15>. In FIG. 5, the 16 latch circuits XDL<0> to XDL<15> are shown as latch circuits XDL<15:0>. Each of the latch circuits XDL is coupled to the corresponding sense amplifier unit SAU. Each latch circuit XDL is associated with a bit line BL via the corresponding sense amplifier unit SAU, and temporarily stores data related to the corresponding bit line BL. Each of the 16 latch circuits XDL<0> to XDL<15> is coupled to a corresponding one of the data lines IO. By being coupled to a corresponding sense amplifier unit SAU and a corresponding data line IO, each latch circuit XDL allows data to be transmitted and received between the sense amplifier unit SAU and the input and output circuit 16. That is, the data received from, for example, the memory controller 3 is first stored in the latch circuits XDL in the data register 13 via the data lines IO, and then transferred to the sense amplifier units SAU in the sense amplifier module 12 via the coupling between the latch circuits XDL and the sense amplifier units SAU. Similarly, the data in the sense amplifier units SAU is transferred to the latch circuits XDL and stored therein, transferred to the input and output circuit 16 via the data lines IO, and then output to the outside of the semiconductor memory device 1.

FIG. 6 is a diagram illustrating an example of a part of a circuit configuration of the sense amplifier module 12 in the semiconductor memory device 1 according to the first embodiment. Hereinafter, a circuit configuration of a sense amplifier unit SAU in the sense amplifier module 12 will be described in detail.

As shown in FIG. 6, a high-voltage n-channel MOS transistor 12a is provided for each sense amplifier unit SAU in the sense amplifier module 12. One sense amplifier unit SAU includes a sense amplifier circuit SAC, three latch circuits SDL, UDL, and LDL, a precharge circuit 121, and a bus switch 122. The number of latch circuits included in the sense amplifier unit SAU is not limited to three, and may be designed to be any number. For example, the number of latch circuits included in the sense amplifier unit SAU is designed based on the number of bits of data stored in each memory cell transistor MT.

A first terminal of the transistor 12a is coupled to an interconnect BLI in the sense amplifier module 12, and a second terminal of the transistor 12a is coupled to a corresponding bit line BL. A control signal BLS is applied to a gate of the transistor 12a. The control signal BLS is generated by, for example, the sequencer 21.

In the sense amplifier unit SAU, the sense amplifier circuit SAC, the three latch circuits SDL, UDL, and LDL, and the precharge circuit 121 are coupled via a bus LBUS.

The sense amplifier circuit SAC senses data in a memory cell transistor MT coupled to the corresponding bit line BL, and applies a voltage to the corresponding bit line BL according to write data. That is, the sense amplifier circuit SAC is a module that directly controls the bit line BL.

The sense amplifier circuit SAC includes n-channel MOS transistors 12b to 12j, a p-channel MOS transistor 12k, and a capacitor element 121.

A first terminal of the transistor 12b is coupled to the interconnect BLI, and a second terminal of the transistor 12b is coupled to a node SCOM. A control signal BLC is applied to a gate of the transistor 12b. The transistor 12b allows the corresponding bit line BL to be clamped at a potential determined according to the control signal BLC.

A first terminal of the transistor 12c is coupled to the interconnect BLI, and a voltage VLSA is applied to a second terminal of the transistor 12c. A control signal NLO is applied to a gate of the transistor 12c. A first terminal of the transistor 12d is coupled to the node SCOM, and a second terminal of the transistor 12d is coupled to a first terminal of the transistor 12k. A control signal BLX is applied to a gate of the transistor 12d. A power-supply voltage VHSA is applied to a second terminal of the transistor 12k, and a gate of the transistor 12k is coupled to a node INV_S, which will be described later. A first terminal of the transistor 12e is coupled to the node SCOM, and a second terminal of the transistor 12e is coupled to a node SEN. A control signal XXL is applied to a gate of the transistor 12e. A first electrode of the capacitor element 121 is coupled to the node SEN, and a clock signal CLK is input to a second electrode of the capacitor element 121. The clock signal CLK is input to a first terminal of the transistor 12f, and a second terminal of the transistor 12f is coupled to a first terminal of the transistor 12g. A gate of the transistor 12f is coupled to the node SEN. A second terminal of the transistor 12g is coupled to the bus LBUS, and a control signal STB is applied to a gate of the transistor 12g.

A first terminal of the transistor 12h is coupled to the node SEN, and a second terminal of the transistor 12h is coupled to the bus LBUS. A control signal BLQ is applied to a gate of the transistor 12h. A first terminal of the transistor 12i is coupled to the node SEN, and a second terminal of the transistor 12i is coupled to a first terminal of the transistor 12j. A control signal LSL is applied to a gate of the transistor 12i. A second terminal of the transistor 12j is grounded, and a gate of the transistor 12j is coupled to the bus LBUS.

The above-described control signals BLC, NLO, BLX, XXL, STB, BLQ, and LSL are generated by, for example, the sequencer 21.

The latch circuits SDL, UDL, and LDL temporarily store data. When data is written, the sense amplifier circuit SAC controls the bit line BL according to the data stored in one of the three latch circuits, e.g., the latch circuit SDL. The other latch circuits UDL and LDL are used for performing, for example, a multi-value operation, in which data of two or more bits is stored in the individual memory cell transistors.

The latch circuit SDL includes, for example, inverters 12m and 12n, and n-channel MOS transistors 12o and 12p. An input terminal of the inverter 12m is coupled to a node LAT_S, and an output terminal of the inverter 12m is coupled to a node INV_S. An input terminal of the inverter 12n is coupled to the node INV_S, and an output terminal of the inverter 12n is coupled to the node LAT_S. A first terminal of the transistor 12o is coupled to the node INV_S, and a second terminal of the transistor 12o is coupled to the bus LBUS. A control signal STI is applied to a gate of the transistor 12o. A first terminal of the transistor 12p is coupled to the node LAT_S, and a second terminal of the transistor 12p is coupled to the bus LBUS. A control signal STL is applied to a gate of the transistor 12p. The nodes LAT_S and INV_S have, for example, either low (L) level or high (H) level, according to the data stored in the latch circuit SDL. In an example, the data stored in the node LAT_S corresponds to the data stored in the latch circuit SDL, and the data stored in the node INV_S corresponds to the inverted data of the data stored in the node LAT_S.

The latch circuits UDL and LDL have a circuit configuration similar to, for example, that of the latch circuit SDL; accordingly, descriptions thereof are omitted. In this manner, in each sense amplifier unit SAU, the sense amplifier circuit SAC and the latch circuits SDL, UDL, and LDL are coupled via the bus LBUS in such a manner that data can be transmitted and received therebetween.

The precharge circuit 121 allows the bus LBUS to be precharged. The precharge circuit 121 includes, for example, an n-channel MOS transistor 12q. A first terminal of the transistor 12q is coupled to the bus LBUS, and a voltage VHLB is applied to a second terminal of the transistor 12q. A control signal LPC is applied to a gate of the transistor 12q. By the voltage VHLB transferred to the bus LBUS by the precharge circuit 121, the bus LBUS is precharged.

The bus switch 122 couples the bus LBUS and a bus DBUS. The bus switch 122 includes, for example, an re-channel MOS transistor 12r. A first terminal of the transistor 12r is coupled to the bus LBUS, and a second terminal of the transistor 12r is coupled to the bus DBUS. A control signal DSW is applied to a gate of the transistor 12r.

The above-described control signals STI, STL, LPC, and DSW are generated by, for example, the sequencer 21.

The bus DBUS is coupled to a corresponding latch circuit XDL in the data register 13. The data DAT transmitted from, for example, the memory controller 3 is first stored in the latch circuit XDL, and then transferred to one of the latch circuits SDL, LDL, and UDL via the buses DBUS and LBUS, and vice versa. The configuration of the latch circuit XDL is approximately the same as that of the latch circuit SDL described above; accordingly, a description thereof is omitted.

The circuit configuration of the sense amplifier module 12 described in detail above is merely an example, and various configurations may be adopted as the sense amplifier module 12.

Next, a relationship of coupling between the 16 sense amplifier units SAU<0> to SAU<15> described with reference to FIG. 5 and the 16 latch circuits XDL<0> to XDL<15> corresponding one to one to the sense amplifier units SAU<0> to SAU<15> will be described with reference to FIGS. 7 and 8. The other sense amplifier units SAU<0> to SAU<15> and the latch circuits XDL<0> to XDL<15> shown in FIG. 5 but not shown in FIGS. 7 and 8 have a similar relationship of coupling.

Figure 7:
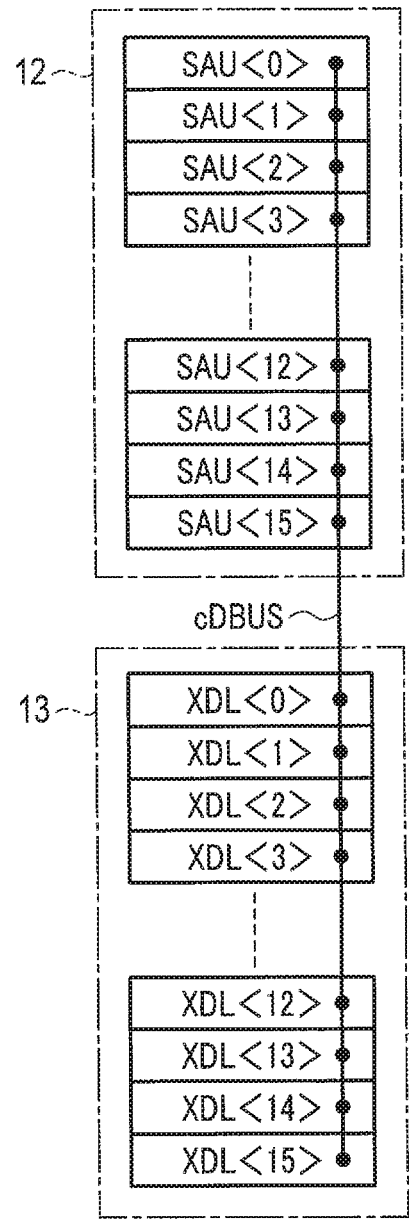
FIG. 7 is a diagram illustrating an example of a relationship of coupling between a plurality of sense amplifier units SAU and a plurality of latch circuits XDL in a semiconductor memory device according to a comparative example of the first embodiment.

FIG. 7 is a diagram illustrating an example of a relationship of coupling between a plurality of sense amplifier units SAU and a plurality of latch circuits XDL in a semiconductor memory device according to a comparative example of the first embodiment.

In the example of FIG. 7, 16 sense amplifier units SAU<0> to SAU<15> are commonly coupled to one bus cDBUS. In addition, 16 latch circuits XDL<0> to XDL<15> are commonly coupled to the bus cDBUS. In this manner, the sense amplifier units SAU and the latch circuits XDL, corresponding to the sense amplifier units SAU, are coupled, as described with reference to FIG. 5. The bus cDBUS corresponds to, for example, the bus DBUS shown in FIG. 6.

Figure 8:
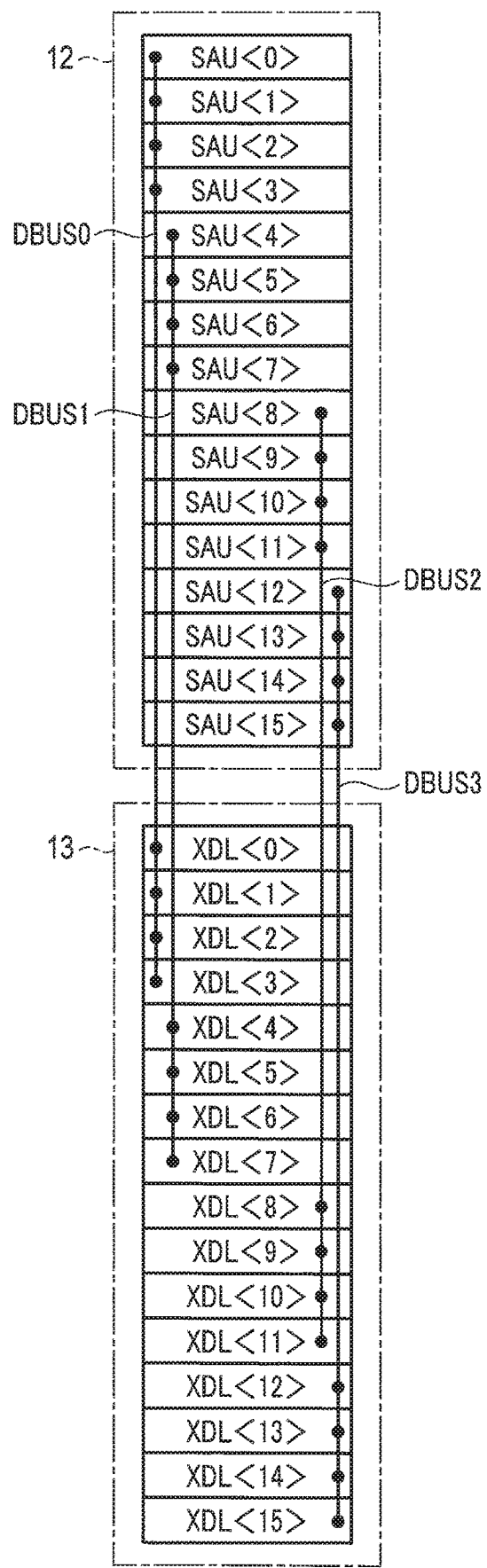
FIG. 8 is a diagram illustrating an example of a relationship of coupling between a plurality of sense amplifier units SAU and a plurality of latch circuits XDL in the semiconductor memory device according to the first embodiment.

FIG. 8 is a diagram illustrating an example of a relationship of coupling between a plurality of sense amplifier units SAU and a plurality of latch circuits XDL in the semiconductor memory device 1 according to the first embodiment.

In the example of FIG. 8, four sense amplifier units SAU and four latch circuits XDL are commonly coupled to one bus DBUS. A specific configuration will be described below.

Four sense amplifier units SAU<0> to SAU<3> are commonly coupled to one bus DBUS0. Four latch circuits XDL<0> to XDL<3>, corresponding one to one to the sense amplifier units SAU<0> to SAU<3>, are commonly coupled to the bus DBUS0. Similarly, four sense amplifier units SAU<4> to SAU<7> are commonly coupled to one bus DBUS1, and four latch circuits XDL<4> to XDL<7>, corresponding one to one to the sense amplifier units SAU<4> to SAU<7>, are commonly coupled to the bus DBUS1. Similarly, four sense amplifier units SAU<8> to SAU<11> are commonly coupled to one bus DBUS2, and four latch circuits XDL<8> to XDL<11>, corresponding one to one to the sense amplifier units SAU<8> to SAU<11>, are commonly coupled to the bus DBUS2. Similarly, four sense amplifier units SAU<12> to SAU<15> are commonly coupled to one bus DBUS3, and four latch circuits XDL<12> to XDL<15>, corresponding one to one to the sense amplifier units SAU<12> to SAU<15>, are commonly coupled to the bus DBUS3. In this manner, the sense amplifier units SAU and the latch circuits XDL, corresponding to the sense amplifier units SAU, are coupled, as described with reference to FIG. 5. The buses DBUS0 to DBUS3 correspond to, for example, the bus DBUS shown in FIG. 6.

Next, structures for the couplings shown in FIGS. 7 and 8 between the sense amplifier units SAU<0> to SAU<15>, the bus cDBUS or the buses DBUS0, 1, 2, and 3, and the latch circuits XDL<0> to XDL<15> will be described. First, a positional relationship between metal interconnect layers in the semiconductor memory device 1 according to the first embodiment and those in the semiconductor memory device according to the comparative example of the first embodiment will be described.

Figure 9:
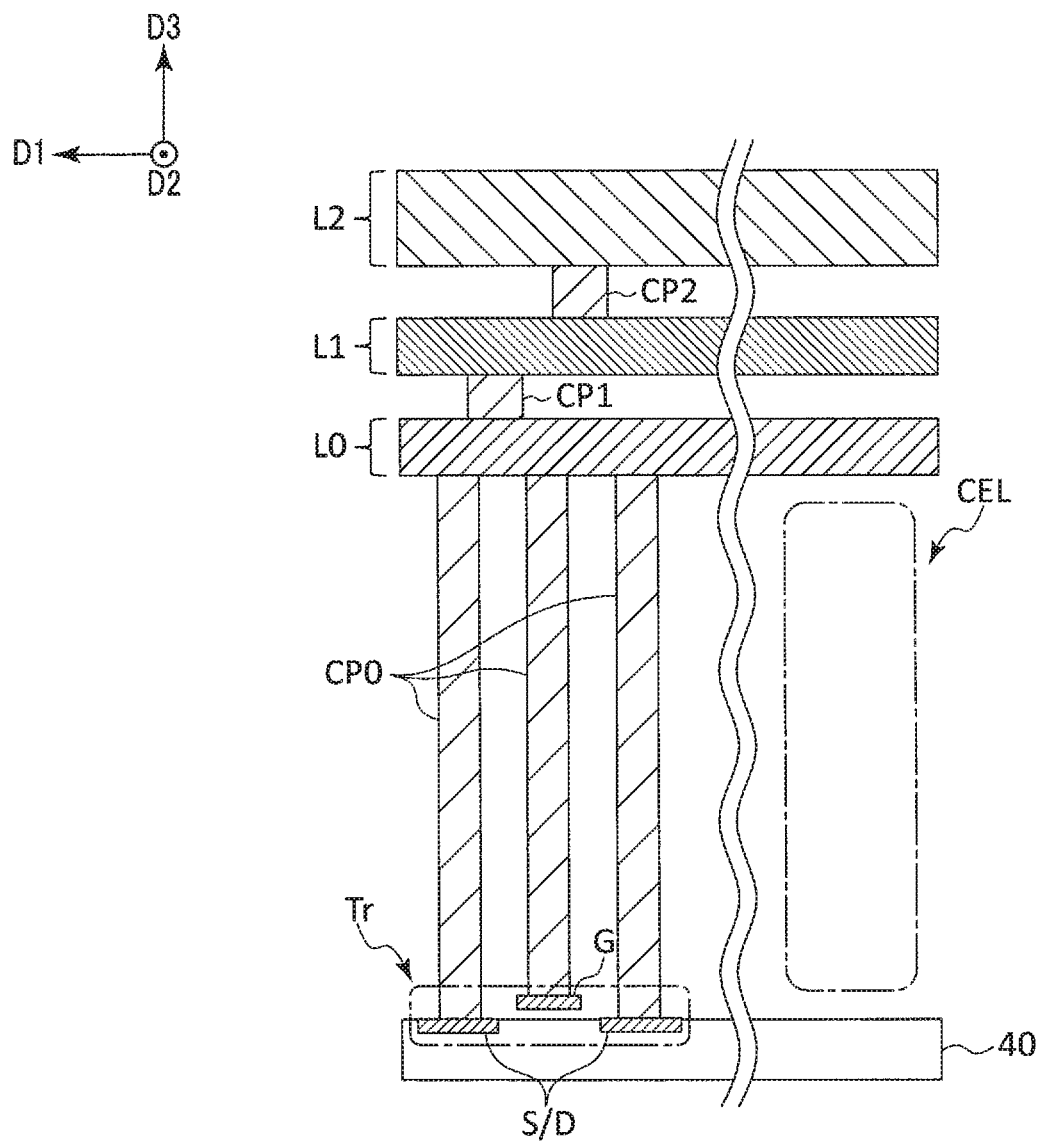
FIG. 9 is a diagram illustrating an example of a cross-sectional structure of the semiconductor memory device according to the first embodiment.

FIG. 9 is a diagram illustrating an example of a cross-sectional structure of the semiconductor memory device 1 according to the first embodiment. In the description that follows, a cross-sectional structure of the semiconductor memory device 1 according to the first embodiment will be described; however, the semiconductor memory device according to the comparative example of the first embodiment has a structure similar to the cross-sectional structure that will be described with reference to FIG. 9.

In a manner similar to the structure described with reference to FIG. 4, a memory cell portion CEL having a structure same as or similar to that of the memory pillar 43 shown in FIG. 4 is provided above the semiconductor substrate 40. A transistor Tr is provided on an upper surface of the semiconductor substrate 40. The transistor Tr is, for example, a peripheral circuit element, and is, for example, a transistor in the sense amplifier unit SAU. The transistor Tr includes a gate electrode G provided on an upper surface of the semiconductor substrate 40 with a gate insulator interposed therebetween, and a pair of source/drain regions S/D provided on the surface of the semiconductor substrate 40 so as to interpose a region below the gate insulator.

Contact plugs CP0 are provided above the gate electrode G and the source/drain regions S/D of the transistor Tr. An upper surface of each of the contact plugs CP0 is connected to interconnects in a metal interconnect layer L0 provided above the memory cell portion CEL. An interconnect in the metal interconnect layer L0 is provided so as to extend, for example, in the first direction D1, and functions as a bus DBUS.

A contact plug CP1 is provided on an upper surface of an interconnect in the metal interconnect layer L0. An upper surface of the contact plug CP1 is connected to an interconnect in a metal interconnect layer L1. An interconnect in the metal interconnect layer L1 is provided so as to extend in, for example, the first direction D1, and functions as an interconnect BLI.

A contact plug CP2 is provided on an upper surface of an interconnect in the metal interconnect layer L1. An upper surface of the contact plug CP2 is connected to an interconnect in a metal interconnect layer L2.

In the description that follows, contact plugs that connect the semiconductor substrate 40 or gate electrodes G above the semiconductor substrate 40 and interconnects in the metal interconnect layer L0 will be collectively referred to as a "contact plug CP0". Similarly, contact plugs that connect interconnects in the metal interconnect layer L0 and interconnects in the metal interconnect layer L1 will be collectively referred to as a "contact plug CP1", and contact plugs that connect interconnects in the metal interconnect layer L1 and interconnects in the metal interconnect layer L2 will be collectively referred to as a "contact plug CP2".

Interlayer insulators (which are not shown in FIG. 9) are provided in regions between the memory cell portion CEL, the transistor Tr, the interconnects in the metal interconnect layers L0, L1, and L2, and the contact plugs CP0, CP1, and CP2.

In the description that follows, the semiconductor memory device according to the comparative example of the first embodiment will be described using the same reference symbols as those shown in FIG. 9.

Figure 10:
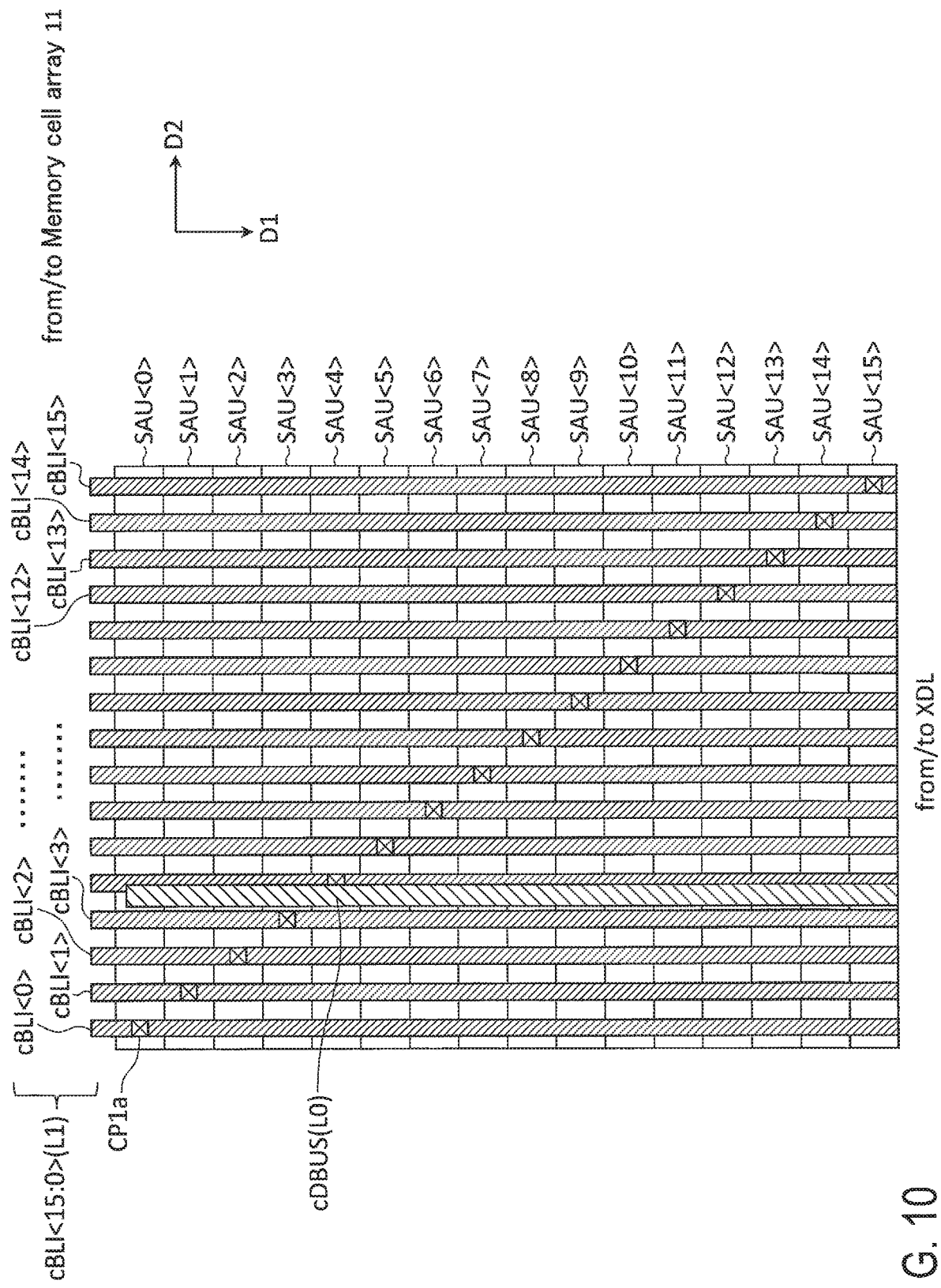
FIG. 10 is a diagram illustrating an example of a layout of the sense amplifier units SAU and a bus cDBUS, in the semiconductor memory device according to the comparative example of the first embodiment.

FIG. 10 is a diagram illustrating an example of a layout of the sense amplifier units SAU<0> to SAU<15> and the bus cDBUS shown in FIG. 7, in the semiconductor memory device according to the comparative example of the first embodiment. For ease of reference, the positional relationships of the layers as viewed in the third direction D3 are not necessarily shown in FIG. 10 with accuracy.

In a region in which the sense amplifier module is located, 16 sense amplifier units SAU<0> to SAU<15> are provided side by side along the first direction D1, in the order of SAU<0>, SAU<1>, . . . , and SAU<15>.

In the metal interconnect layer L1, 16 interconnects cBLI<0> to cBLI<15> extending in the first direction D1 are provided side by side at intervals along the second direction D2, in the order of cBLI<0>, cBLI<1>, . . . , and cBLI<15>. Each of the 16 interconnects cBLI<0> to cBLI<15> corresponds to, for example, the interconnect BLI shown in FIG. 6. The interconnect cBLI<k> corresponds to the sense amplifier unit SAU<k>, where k represents an integer of one of 0 to 15. Each of the 16 interconnects cBLI<0> to cBLI<15> extends, for example, along the first direction D1 in the metal interconnect layer L1, at least from a region above the sense amplifier unit SAU<0> to a region above the sense amplifier unit SAU<15>.

In the metal interconnect layer L0, a bus cDBUS extending in the first direction D1 is provided. The bus cDBUS extends, for example, along the first direction D1 in the metal interconnect layer L0, at least from a region above the sense amplifier unit SAU<0> toward the latch circuits XDL through a region above the sense amplifier unit SAU<15>.

In a region in which, for example, the sense amplifier unit SAU<0> and the interconnect cBLI<0> overlap as viewed in the third direction D3, the interconnect cBLI<0> is connected to the sense amplifier unit SAU<0> via a contact plug CP1a, which connects an interconnect in the metal interconnect layer L1 and an interconnect in the metal interconnect layer L0, via an interconnect in the metal interconnect layer L0, and via a contact plug CP0a, which connects an interconnect in the metal interconnect layer L0 and the semiconductor substrate 40 (a source region or a drain region of a transistor). Of the connection via the contact plug CP1a, via the interconnect in the metal interconnect layer L0, and via the contact plug CP0a, FIG. 10 shows only the connection via the contact plug CP1a for simplicity. Similarly, each of the interconnects cBLI<1> to cBLI<15> is connected to the corresponding sense amplifier unit SAU, of the sense amplifier units SAU<1> to SAU<15>.

The sense amplifier unit SAU<0> is connected to the bus cDBUS via a contact plug CP0b, which connects the semiconductor substrate 40 and an interconnect in the metal interconnect layer L0, in a region in which, for example, the sense amplifier unit SAU<0> and the bus cDBUS overlap as viewed in the third direction D3. For simplicity, the contact plug CP0b is not shown in FIG. 10. Similarly, each of the sense amplifier units SAU<1> to SAU<15> are connected to the bus cDBUS.

Figure 11:
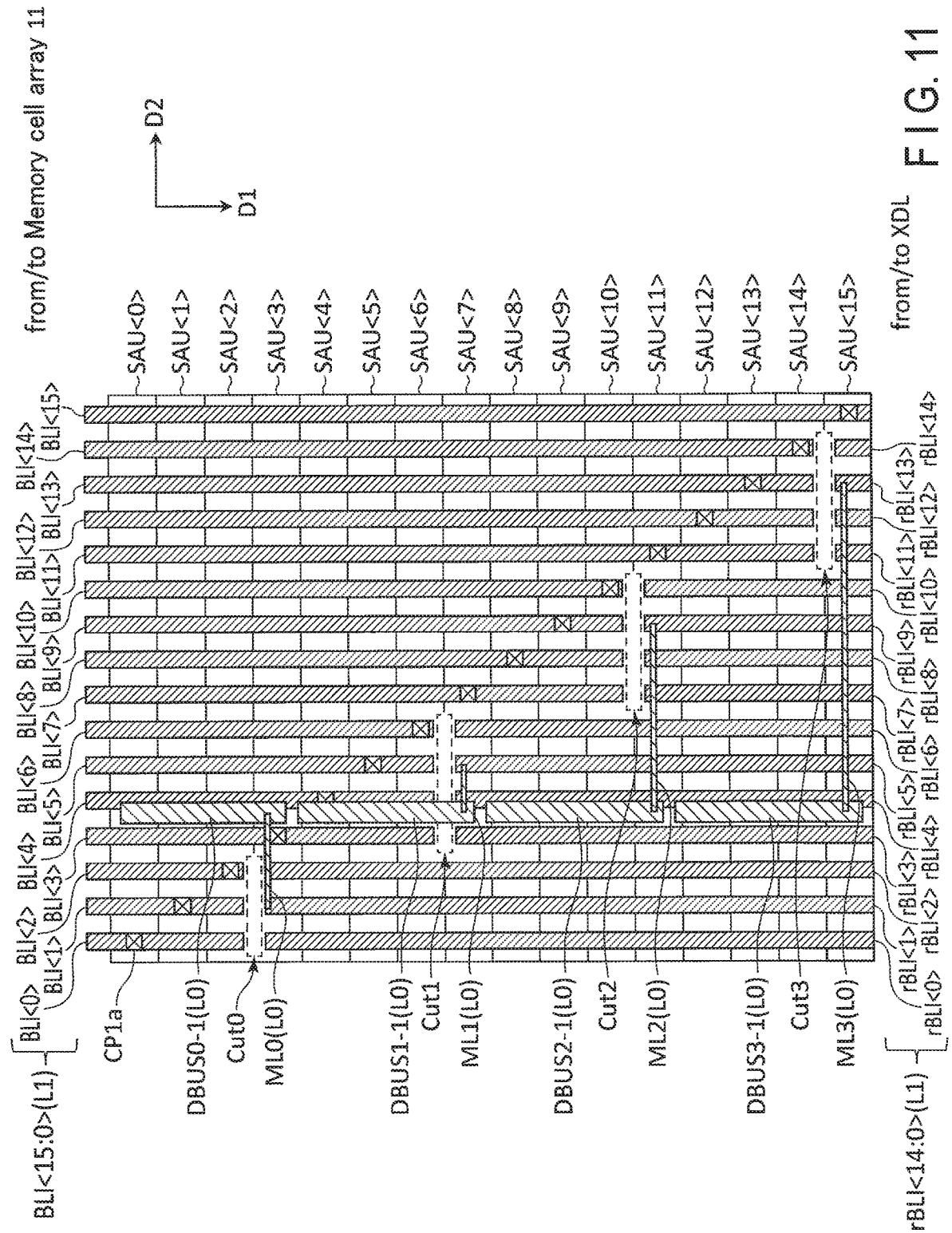
FIG. 11 is a diagram illustrating an example of a layout of the sense amplifier units SAU and buses DBUS, in the semiconductor memory device according to the first embodiment.

FIG. 11 is a diagram illustrating an example of a layout of the sense amplifier units SAU<0> to SAU<15> and the buses DBUS0, DBUS1, DBUS2, and DBUS3 shown in FIG. 8, in the semiconductor memory device 1 according to the first embodiment. For ease of reference, the positional relationships of the layers as viewed in the third direction D3 are not necessarily shown in FIG. 11 with accuracy.

In a region in which the sense amplifier module 12 is located, 16 sense amplifier units SAU<0> to SAU<15> are provided side by side along the first direction D1, in the order of SAU<0>, SAU<1>, . . . , and SAU<15>.

In the metal interconnect layer L1, 16 interconnects BLI<0> to BLI<15> extending in the first direction D1 are provided side by side at intervals along the second direction D2, in the order of BLI<0>, BLI<1>, and BLI<15>. Each of the 16 interconnects BLI<0> to BLI<15> corresponds to, for example, the interconnect BLI shown in FIG. 6. The interconnect BLI<k> corresponds to the sense amplifier unit SAU<k>, where k represents an integer of one of 0 to 15.

Each of the interconnects BLI<0> to BLI<2> extends, for example, along the first direction D1 in the metal interconnect layer L1, at least from a region above the sense amplifier unit SAU<0> to a region above the sense amplifier unit SAU<2>. For example, end surfaces of the respective interconnects BLI<0> to BLI<2> on the side facing the first direction D1 are aligned along the second direction D2, and are, for example, at the same position as viewed in the first direction D1.

Each of the interconnects BLI<3> to BLI<6> extends, for example, along the first direction D1, in the metal interconnect layer L1, at least from a region above the sense amplifier unit SAU<0> to a region above the sense amplifier unit SAU<6>. For example, end surfaces of the respective interconnects BLI<3> to BLI<6> on the side facing the first direction D1 are aligned along the second direction D2, and are, for example, at the same position as viewed in the first direction D1.

Each of the interconnects BLI<7> to BLI<10> extends, for example, along the first direction D1 in the metal interconnect layer L1, at least from a region above the sense amplifier unit SAU<0> to a region above the sense amplifier unit SAU<10>. For example, end surfaces of the respective interconnects BLI<7> to BLI<10> on the side facing the first direction D1 are aligned along the second direction D2, and are, for example, at the same position as viewed in the first direction D1.

Each of the interconnects BLI<11> to BLI<14> extends, for example, along the first direction D1 in the metal interconnect layer L1, at least from a region above the sense amplifier unit SAU<0> to a region above the sense amplifier unit SAU<14>. For example, end surfaces of the respective interconnects BLI<11> to BLI<14> on the side facing the first direction D1 are aligned along the second direction D2, and are, for example, at the same position as viewed in the first direction D1.

The interconnect BLI<15> extends, for example, along the first direction D1 in the metal interconnect layer L1, at least from a region above the sense amplifier unit SAU<0> to a region above the sense amplifier unit SAU<15>.

Furthermore, in the metal interconnect layer L1, 15 interconnects rBLI<0> to rBLI<14> extending in the first direction D1 are provided side by side at intervals along the second direction D2, in the order of rBLI<0>, rBLI<1>, . . . , and rBLI<14>. The interconnect rBLI<k> corresponds to the interconnect BLI<k>, where k represents an integer of one of 0 to 14.

Each of the interconnects rBLI<0> to rBLI<14> and the corresponding interconnect BLI, of the interconnects BLI<0> to BLI<14> are provided side by side with a distance therebetween along the first direction D1. For example, an end surface of each of the interconnects rBLI<0> to rBLI<14> on the side facing the direction opposite to the first direction D1 is opposed to an end surface of the corresponding interconnect BLI, of the interconnects BLI<0> to BLI<14>, on the side facing the first direction.

Each of the interconnects rBLI<0> to rBLI<2> extends, for example, along the first direction D1 in the metal interconnect layer L1, at least from a region above the sense amplifier unit SAU<3> to a region above the sense amplifier unit SAU<15>. For example, end surfaces of the respective interconnects rBLI<0> to rBLI<2> on the side facing the direction opposite to the first direction D1 are aligned along the second direction D2, and are, for example, at the same position as viewed in the first direction D1.

Each of the interconnects rBLI<3> to rBLI<6> extends, for example, along the first direction D1 in the metal interconnect layer L1, at least from a region above the sense amplifier unit SAU<7> to a region above the sense amplifier unit SAU<15>. For example, end surfaces of the respective interconnects rBLI<3> to rBLI<6> on the side facing the direction opposite to the first direction D1 are aligned along the second direction D2, and are, for example, at the same position as viewed in the first direction D1.

Each of the interconnects rBLI<7> to rBLI<10> extends, for example, along the first direction D1 in the metal interconnect layer L1, at least from a region above the sense amplifier unit SAU<11> to a region above the sense amplifier unit SAU<15>. For example, end surfaces of the respective interconnects rBLI<7> to rBLI<10> on the side facing the direction opposite to the first direction D1 are aligned along the second direction D2, and are, for example, at the same position as viewed in the first direction D1.

Each of the interconnects rBLI<11> to rBLI<14> extends, for example, along the first direction D1 in the metal interconnect layer L1, at least in a region above the sense amplifier unit SAU<15>. For example, end surfaces of the respective interconnects rBLI<11> to rBLI<14> on the side facing the direction opposite to the first direction D1 are aligned along the second direction D2, and are, for example, at the same position as viewed in the first direction D1.

The interconnects BLI<k> and rBLI<k> correspond to, for example, the interconnect cBLI<k> shown in FIG. 10 divided in a plane vertical to the first direction D1, where k represents an integer of one of 0 to 14. More specifically, the interconnects BLI<k> and rBLI<k> correspond to, for example, the interconnect cBLI<k> shown in FIG. 10 divided at an area Cut0 shown in FIG. 11, where k is from 0 to 2. The interconnects BLI<k> and rBLI<k> correspond to, for example, the interconnect cBLI<k> shown in FIG. 10 divided at an area Cut1 shown in FIG. 11, where k is from 3 to 6. The interconnects BLI<k> and rBLI<k> correspond to, for example, the interconnect cBLI<k> shown in FIG. 10 divided at an area Cut2 shown in FIG. 11, where k is from 7 to 10. The interconnects BLI<k> and rBLI<k> correspond to, for example, the interconnect cBLI<k> shown in FIG. 10 divided at an area Cut3 shown in FIG. 11, where k is from 11 to 14. At this time, the interconnect BLI<k> and the interconnect rBLI<k> are, for example, equal in width, where k is an integer of one of 0 to 14. The widths of the interconnects BLI<k> and rBLI<k> correspond to the lengths of the interconnects BLI<k> and rBLI<k> in the second direction D2. Formation of the above-described interconnects BLI<k> and rBLI<k> can be achieved by, for example, a lithography process and etching.

In the metal interconnect layer L0, buses DBUS0-1, DBUS1-1, DBUS2-1, and DBUS3-1 extending in the first direction D1 are provided at intervals along the first direction D1. An end surface of the bus DBUS0-1 on the side facing the first direction D1 and an end surface of the bus DBUS1-1 facing the direction opposite to the first direction D1 are opposed to each other. Similarly, an end surface of the bus DBUS1-1 on the side facing the first direction D1 and an end surface of the bus DBUS2-1 on the side facing the direction opposite to the first direction D1 are opposed to each other. Similarly, an end surface of the bus DBUS2-1 on the side facing the first direction D1 and an end surface of the bus DBUS3-1 on the side facing the direction opposite to the first direction D1 are opposed to each other.

The bus DBUS0-1 extends, for example, along the first direction D1 in the metal interconnect layer L0, at least from a region above the sense amplifier unit SAU<0> to a region above the sense amplifier unit SAU<3>, so as to protrude toward the first direction D1 from the positions where the end surfaces of the interconnects rBLI<0> to rBLI<2> on the side facing the direction opposite to the first direction D1 are provided.

The bus DBUS1-1 extends, for example, along the first direction D1 in the metal interconnect layer L0, at least from a region above the sense amplifier unit SAU<4> to a region above the sense amplifier unit SAU<7>, so as to protrude toward the first direction D1 from the positions where the end surfaces of the interconnects rBLI<3> to rBLI<6> on the side facing the direction opposite to the first direction D1 are provided.

The bus DBUS2-1 extends, for example, along the first direction D1 in the metal interconnect layer L0, at least from a region above the sense amplifier unit SAU<8> to a region above the sense amplifier unit SAU<11>, so as to protrude toward the first direction D1 from the positions where the end surfaces of the interconnects rBLI<7> to rBLI<10> on the side facing the direction opposite to the first direction D1 are provided.

The bus DBUS3-1 extends, for example, along the first direction D1 in the metal interconnect layer L0, at least from a region above the sense amplifier unit SAU<12> to a region above the sense amplifier unit SAU<15>, so as to protrude toward the first direction D1 from the positions where the end surfaces of the interconnects rBLI<11> to rBLI<14> on the side facing the direction opposite to the first direction D1 are provided.

The buses DBUS0-1, DBUS1-1, DBUS2-1, and DBUS3-1 correspond to, for example, the bus cDBUS shown in FIG. 10 divided in a plane vertical to the first direction D1. At this time, the buses DBUS0-1, DBUS1-1, DBUS2-1, and DBUS3-1 are, for example, equal in width. The widths of the buses DBUS0-1, DBUS1-1, DBUS2-1, and DBUS3-1 correspond to the lengths of the buses DBUS0-1, DBUS1-1, DBUS2-1, and DBUS3-1 in the second direction D2.

In the metal interconnect layer L0, interconnects ML0, ML1, ML2, and ML3 extending in the second direction D2 are further provided.

The interconnect ML0 extends, for example, along the second direction D2 in the metal interconnect layer L0, at least from a region where the sense amplifier unit SAU<3> and the interconnect rBLI<1> overlap as viewed in the third direction D3 to the bus DBUS0-1. The interconnect ML0 may be formed integrally with the bus DBUS0-1 in the shape of a crank.

The interconnect ML1 extends, for example, along the second direction D2 in the metal interconnect layer L0, at least from the bus DBUS1-1 to a region where the sense amplifier unit SAU<7> and the interconnect rBLI<5> overlap as viewed in the third direction D3. The interconnect ML1 may be formed integrally with the bus DBUS1-1 in the shape of a crank.

The interconnect ML2 extends, for example, along the second direction D2 in the metal interconnect layer L0, at least from the bus DBUS2-1 to a region where the sense amplifier unit SAU<11> and the interconnect rBLI<9> overlap as viewed in the third direction D3. The interconnect ML2 may be formed integrally with the bus DBUS2-1 in the shape of a crank.

The interconnect ML3 extends, for example, along the second direction D2 in the metal interconnect layer L0, at least from the bus DBUS3-1 to a region where the sense amplifier unit SAU<15> and the interconnect rBLI<13> overlap as viewed in the third direction D3. The interconnect ML3 may be formed integrally with the bus DBUS3-1 in the shape of a crank.

Each of the interconnects BLI<0> to BLI<15> is connected to the corresponding sense amplifier unit SAU, of the sense amplifier units SAU<0> to SAU<15>, in a manner similar to, for example, the interconnects cBLI<0> to CBLI<15> described with reference to FIG. 10.

The sense amplifier unit SAU<0> is connected to the bus DBUS0-1 via a contact plug CP0c, which connects the semiconductor substrate 40 and an interconnect in the metal interconnect layer L0, in a region in which, for example, the sense amplifier unit SAU<0> and the bus DBUS0-1 overlap as viewed in the third direction D3. For simplicity, the contact plug CP0c is not shown in FIG. 11. Similarly, each of the sense amplifier units SAU<1> to SAU<3> is connected to the bus DBUS0-1.

In a manner similar to the above-described connection between the sense amplifier units SAU<0> to SAU<3> and the bus DBUS0-1, each of the sense amplifier units SAU<4> to SAU<7> is connected to the bus DBUS1-1, each of the sense amplifier units SAU<8> to SAU<11> is connected to the bus DBUS2-1, and each of the sense amplifier units SAU<12> to SAU<15> is connected to the bus DBUS3-1.

The bus DBUS0-1 is connected to the interconnect ML0, and the interconnect ML0 is connected to an interconnect rBLI<1> via a contact plug CP1b which connects an interconnect in the metal interconnect layer L0 and an interconnect in the metal interconnect layer L1, in a region where, for example, the interconnect ML0 and the interconnect rBLI<1> overlap as viewed in the third direction D3. For simplicity, the contact plug CP1b is not shown in FIG. 11.

In a manner similar to the above-described connection between the bus DBUS0-1 and the interconnect rBLI<1> via the interconnect ML0, the bus DBUS1-1 is connected to the interconnect rBLI<5> via the interconnect ML1, the bus DBUS2-1 is connected to the interconnect rBLI<9> via the interconnect ML2, and the bus DBUS3-1 is connected to the interconnect rBLI<13> via the interconnect ML3.

The bus DBUS0-1, the interconnect ML0, and the interconnect rBLI<1> described above correspond to the bus DBUS0 shown in FIG. 8. Similarly, the bus DBUS1-1, the interconnect ML1, and the interconnect rBLI<5> correspond to the bus DBUS1 shown in FIG. 8, the bus DBUS2-1, the interconnect ML2, and the interconnect rBLI<9> correspond to the bus DBUS2 shown in FIG. 8, and the bus DBUS3-1, the interconnect ML3, and the interconnect rBLI<13> correspond to the bus DBUS3 shown in FIG. 8.

The layout of the sense amplifier units SAU<0> to SAU<15> and the buses DBUS0, DBUS1, DBUS2, and DBUS3 has been described in detail above, by giving an example. The sense amplifier module 12 is capable of providing interconnects BLI<0> to BLI<15> and sense amplifier units SAU<0> to SAU<15>, as shown in FIG. 11, thereby achieving the relationship of connection described in detail with reference to FIG. 11. In the layout shown in FIG. 11, the contact plugs CP1a used for the connection between the interconnect BLI<k> and the sense amplifier unit SAU<k> are aligned so as to approach the first direction D1 as the integer represented by "k" increases from 0 to 15. The layout described in detail with reference to FIG. 11 is merely an example, and the sense amplifier module 12 does not necessarily need to have a layout that matches the layout shown in FIG. 11. For example, the positions of end surfaces and the regions of extension described with respect to the interconnects BLI<0> to BLI<15>, the interconnects rBLI<0> to rBLI<14>, the buses DBUS0-1 to DBUS3-1, and the interconnects ML0 to ML3 are merely examples, and the embodiment is not limited thereto. In addition, the interconnects ML0, ML1, ML2, and ML3 have been described above as being provided in the metal interconnect layer L0, but may be provided in another layer.

FIG. 12 is a diagram for comparison between the widths of the interconnects in the metal interconnect layers L0 and L1 in the semiconductor memory device 1 according to the first embodiment.

In FIG. 12, the widths of the interconnects in the metal interconnect layers L0 and L1 in a region where the sense amplifier module 12 is located, and the widths of the interconnects in the metal interconnect layers L0 and L1 in a region where the data register 13 is located are shown. As shown in FIG. 12, in the region where the sense amplifier module 12 is located, the interconnects in the metal interconnect layer L0 have a width greater than that of the interconnects in the metal interconnect layer L1. It is thus possible in the semiconductor memory device 1 according to the first embodiment to form, in the metal interconnect layer L0, the interconnects ML0 to ML3 integrally with the buses DBUS0-1 to DBUS3-1 in the shape of a crank. On the other hand, in the region in which the data register 13 is located, the interconnects in the metal interconnect layer L0 have a width narrower than that of the interconnects in the metal interconnect layer L1.

Figure 13:
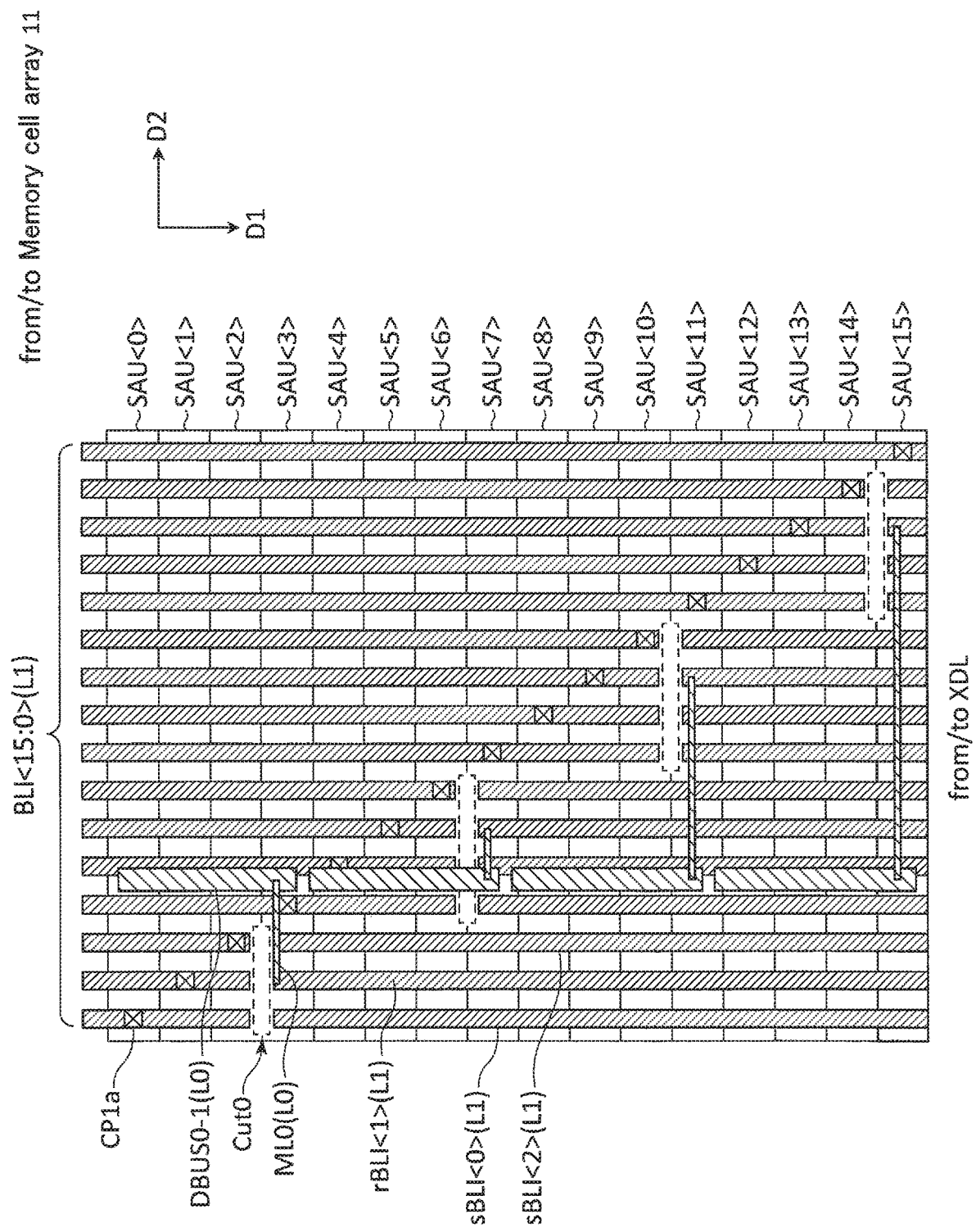
FIG. 13 is a diagram illustrating another example of the layout of the sense amplifier units SAU and the buses DBUS, in the semiconductor memory device according to the first embodiment.
Figure 14:
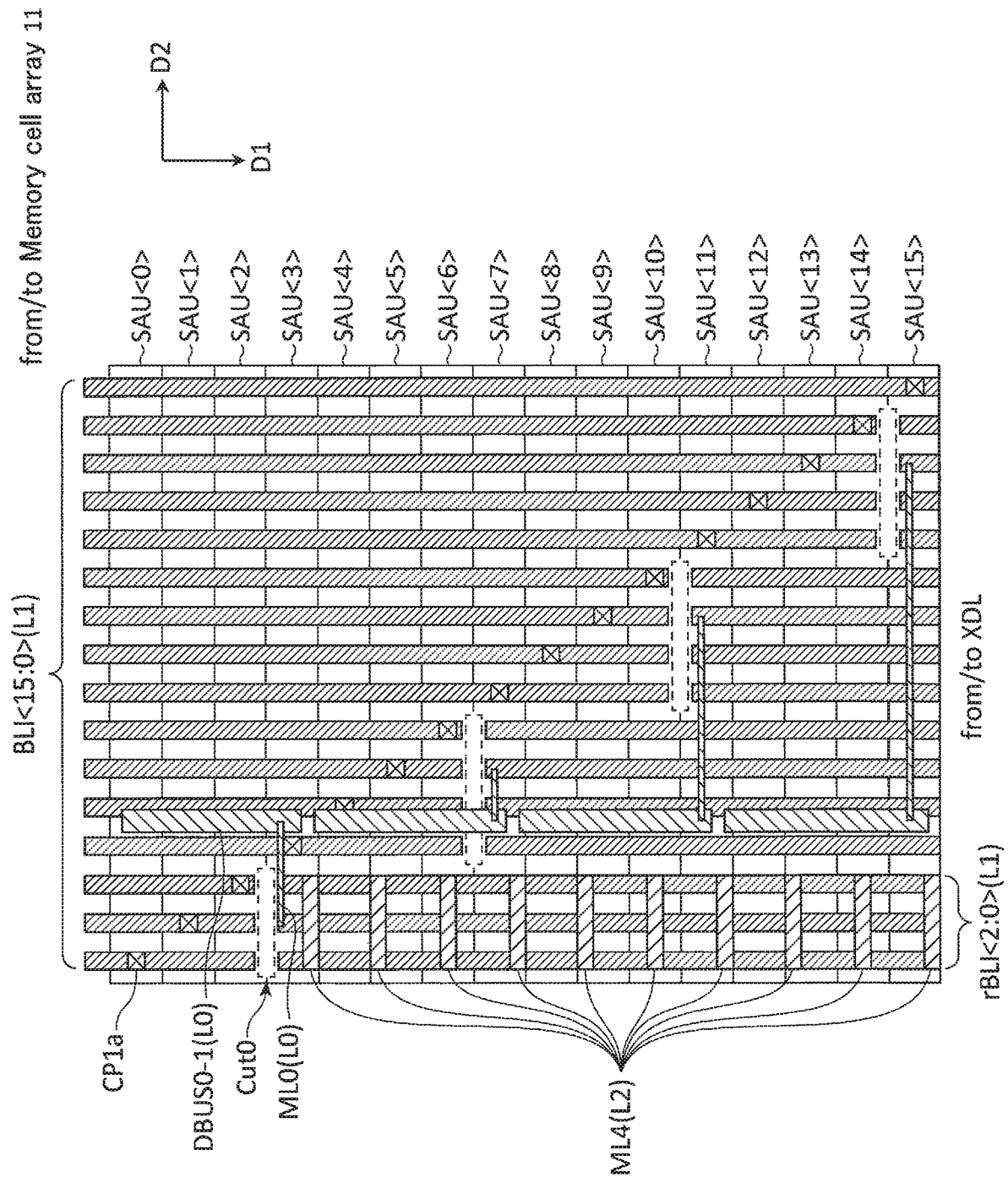
FIG. 14 is a diagram illustrating another example of the layout of the sense amplifier units SAU and the buses DBUS, in the semiconductor memory device according to the first embodiment.
Figure 15:
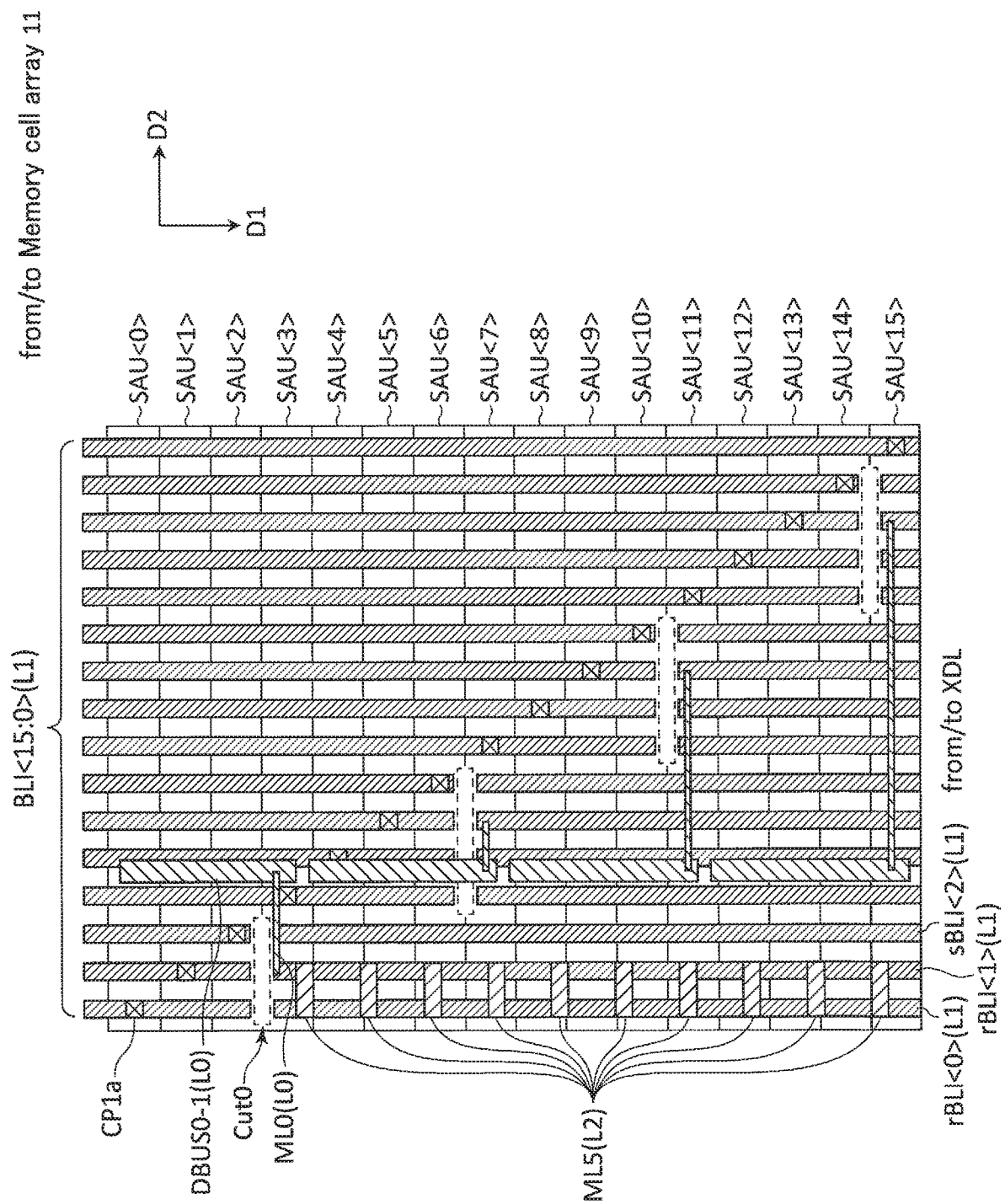
FIG. 15 is a diagram illustrating another example of the layout of the sense amplifier units SAU and the buses DBUS, in the semiconductor memory device according to the first embodiment.

FIGS. 13, 14, and 15 are diagrams illustrating other examples of the layout of the sense amplifier units SAU<0> to SAU<15> and the buses DBUS0, DBUS1, DBUS2 and DBUS3 shown in FIG. 8, in the semiconductor memory device 1 according to the first embodiment.

In the example of the layout shown in FIG. 11, some of the interconnects may be used as shield interconnects. The voltages of the interconnects that function as the shield interconnects are fixed by, for example, the voltage generation circuit 23. For example, the interconnects rBLI<0> and rBLI<2> adjacent to the interconnect rBLI<1> shown in FIG. 11 may be used as shield interconnects sBLI<0> and sBLI<2> for the interconnect rBLI<1>, as shown in FIG. 13.

In the example shown in FIG. 13, the shield interconnects are provided for the interconnect rBLI<1> included in the bus DBUS0; however, the embodiment is not limited thereto. Such shield interconnects may be provided for, for example, one or more interconnects rBLI<1>, rBLI<5>, rBLI<9>, and rBLI<13>, to which data is transferred. At least one shield interconnect may be provided, for example, between the interconnect rBLI<1> and the interconnect rBLI<5>, between the interconnect rBLI<5> and the interconnect rBLI<9>, and between the interconnect rBLI<9> and the interconnect rBLI<13>. When a shield interconnect is provided for an interconnect rBLI, only one of the two interconnects adjacent thereto may be used as a shield interconnect. Furthermore, the interconnects used as the shield interconnect are not limited to such adjacent interconnects.

The example of the layout shown in FIG. 14 corresponds to the parallel connection of the interconnects rBLI<0> to rBLI<2> in the example of the layout shown in FIG. 11, using a plurality of interconnects ML4. FIG. 14 shows a case where the interconnects ML4 are provided in the metal interconnect layer L2, as an example; however, the interconnects ML4 are not limited thereto. For example, the interconnects ML4 may be provided in the metal interconnect layer L1, or any other layer.

The interconnects ML4 are provided in, for example, the metal interconnect layer L2 so as to be aligned at intervals along the first direction D1, and each of the interconnects ML4 extends, for example, along the second direction D2, from a region above the interconnect rBLI<0> to a region above the interconnect rBLI<2>. Each of the interconnects ML4 is connected to the interconnects rBLI<0> to rBLI<2> via contact plugs CP2a. For simplicity, the contact plugs CP2a is not shown in FIG. 14.

In the example shown in FIG. 14, the interconnect rBLI<1> included in the bus DBUS0 is connected in parallel to the interconnects rBLI adjacent thereto; however, the embodiment is not limited thereto. For example, one or more of the interconnects rBLI<1>, rBLI<5>, rBLI<9>, and rBLI<13> may be connected in parallel to the interconnects rBLI adjacent thereto. The number of interconnects rBLI connected in parallel to each other is not limited to three, as in the case of FIG. 14, and may be, for example, two or four, or any other number.

Moreover, for one or more of the interconnects rBLI<1>, rBLI<5>, rBLI<9>, and rBLI<13>, the shield interconnects described with reference to FIG. 13 and the parallel connection described with reference to FIG. 14 may be provided in combination.

FIG. 15 illustrates an example in which the interconnect rBLI<2> shown in FIG. 11 is used as the shield interconnect sBLI<2> for the interconnect rBLI<1>, and the interconnect rBLI<0> is connected in parallel to the interconnect rBLI<1>. The interconnects rBLI<0> and rBLI<1> are connected in parallel using a plurality of interconnects ML5. The interconnects ML5 are similar to the interconnects ML4 described with reference to FIG. 14, except that each of the interconnects ML5 extends, for example, along the second direction D2 from a region above the interconnect rBLI<0> to a region above the interconnect rBLI<1>. The interconnects ML5 described above is merely an example, and the interconnects ML5 are not limited thereto. For example, the interconnects ML5 may be provided in the metal interconnect layer L1, or any other layer.

Figure 16:
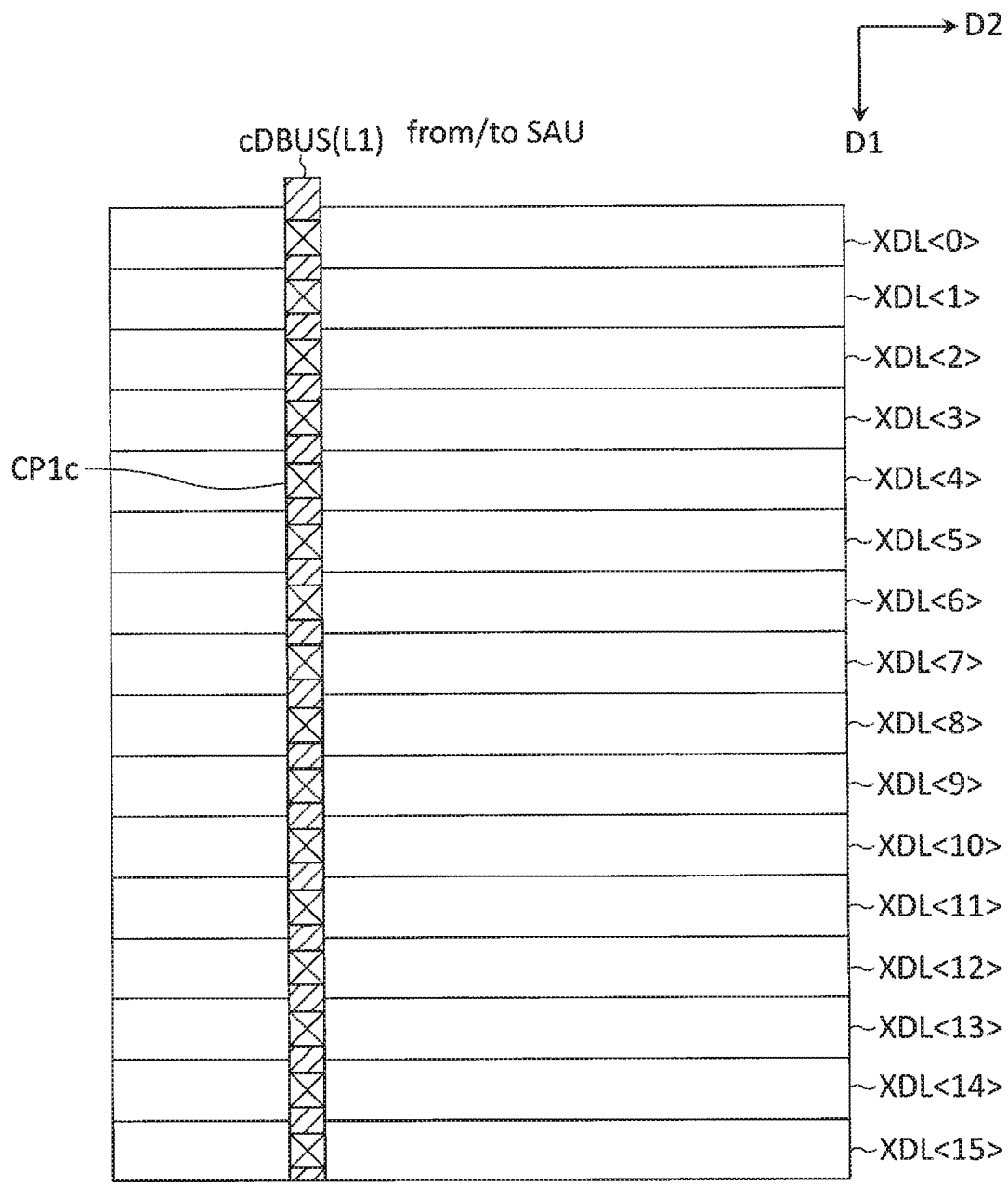
FIG. 16 is a diagram illustrating an example of a layout of the bus cDBUS and the latch circuits XDL, in the semiconductor memory device according to the comparative example of the first embodiment.

FIG. 16 is a diagram illustrating an example of a layout of the bus cDBUS and the latch circuits XDL shown in FIG.

7, in the semiconductor memory device according to the comparative example of the first embodiment.

In a region in which the data register is located, 16 latch circuits XDL<0> to XDL<15> are provided side by side along the first direction D1, in the order of XDL<0>, XDL<1>, . . . and XDL<15>.

The bus cDBUS shown in FIG. 10, which leads from the latch circuits XDL through the region above the sense amplifier unit SAU<15>, extends along the first direction D1 in the metal interconnect layer L1, at least from a region above the latch circuit XDL<0> to a region above the latch circuit XDL<15>, as shown in FIG. 16.

In a region in which, for example, the latch circuit XDL<0> and the bus cDBUS overlap as viewed in the third direction D3, the bus cDBUS is connected to the latch circuit XDL<0> via a contact plug CP1c, which connects an interconnect in the metal interconnect layer L1 and an interconnect in the metal interconnect layer L0, via an interconnect in the metal interconnect layer L0, and via a contact plug CP0d, which connects an interconnect in the metal interconnect layer L0 and the semiconductor substrate 40. Of the connection via the contact plug CP1c, via the interconnect in the metal interconnect layer L0, and via the contact plug CP0d, FIG. 16 shows only the connection via the contact plug CP1c for simplicity. Similarly, the bus cDBUS is connected to each of the latch circuits XDL<1> to XDL<15>.

Figure 17:
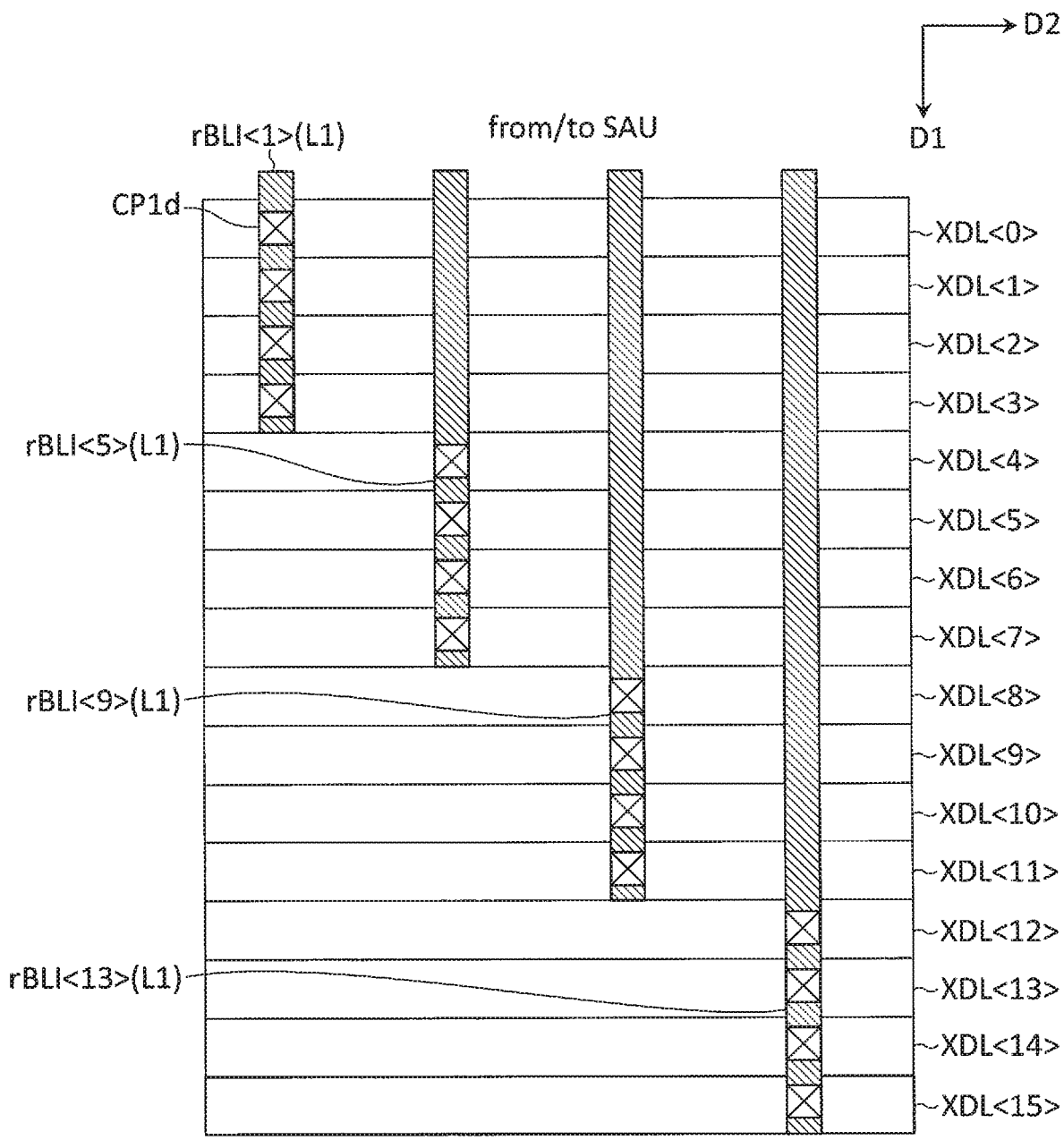
FIG. 17 is a diagram illustrating an example of a layout of the buses DBUS and the latch circuits XDL, in the semiconductor memory device according to the first embodiment.

FIG. 17 is a diagram illustrating an example of a layout of the buses DBUS and the latch circuits XDL shown in FIG. 8, in the semiconductor memory device 1 according to the first embodiment.

In a region in which the data register 13 is located, 16 latch circuits XDL<0> to XDL<15> are provided side by side along the first direction D1, in the order of XDL<0>, XDL<1>, . . . and XDL<15>.

The interconnect rBLI<1> shown in FIG. 11, which leads from the latch circuits XDL through a region above the sense amplifier unit SAU<15>, extends along the first direction D1 in the metal interconnect layer L1, at least from a region above the latch circuit XDL<0> to a region above the latch circuit XDL<3>, as shown in FIG. 17.

The interconnect rBLI<5> shown in FIG. 11, which leads from the latch circuits XDL through a region above the sense amplifier unit SAU<15>, extends along the first direction D1 in the metal interconnect layer L1, at least from a region above the latch circuit XDL<0> to a region above the latch circuit XDL<7>, as shown in FIG. 17.

The interconnect rBLI<9> shown in FIG. 11, which leads from the latch circuits XDL through a region above the sense amplifier unit SAU<15>, extends along the first direction D1 in the metal interconnect layer L1, at least from a region above the latch circuit XDL<0> to a region above the latch circuit XDL<11>, as shown in FIG. 17.

The interconnect rBLI<13> shown in FIG. 11, which leads from the latch circuits XDL through a region above the sense amplifier unit SAU<15>, extends along the first direction D1 in the metal interconnect layer L1, at least from a region above the latch circuit XDL<0> to a region above the latch circuit XDL<15>, as shown in FIG. 17.

In a region in which, for example, the latch circuit XDL<0> and the interconnect rBLI<1> overlap as viewed in the third direction D3, the interconnect rBLI<1> is connected to the latch circuit XDL<0> via a contact plug CP1d, which connects an interconnect in the metal interconnect layer L1 and an interconnect in the metal interconnect layer L0, via an interconnect in the metal interconnect layer L0, and via a contact plug CP0e, which connects an interconnect in the metal interconnect layer L0 and the semiconductor substrate 40. Of the connection via the contact plug CP1d, via the interconnect in the metal interconnect layer L0, and via the contact plug CP0e, FIG. 17 shows only the connection via the contact plug CP1d for simplicity. Similarly, the interconnect rBLI<1> is connected to each of the latch circuits XDL<1> to XDL<3>.

Similarly, the interconnect rBLI<5> is connected to each of the latch circuits XDL<4> to XDL<7>, the interconnect rBLI<9> is connected to each of the latch circuits XDL<8> to XDL<11>, and the interconnect rBLI<13> is connected to each of the latch circuits XDL<12> to XDL<15>.

Operation Example

Next, a data transfer operation using the buses DBUS0 to DBUS3 in the semiconductor memory device 1 according to the first embodiment will be described in detail. In the description that follows, a data transfer operation between the latch circuit SDL and the latch circuit XDL shown in FIG. 6 will be described in detail as an example; however, the same applies to a data transfer operation between another latch circuit in the sense amplifier unit SAU and the latch circuit XDL.

Figure 18:
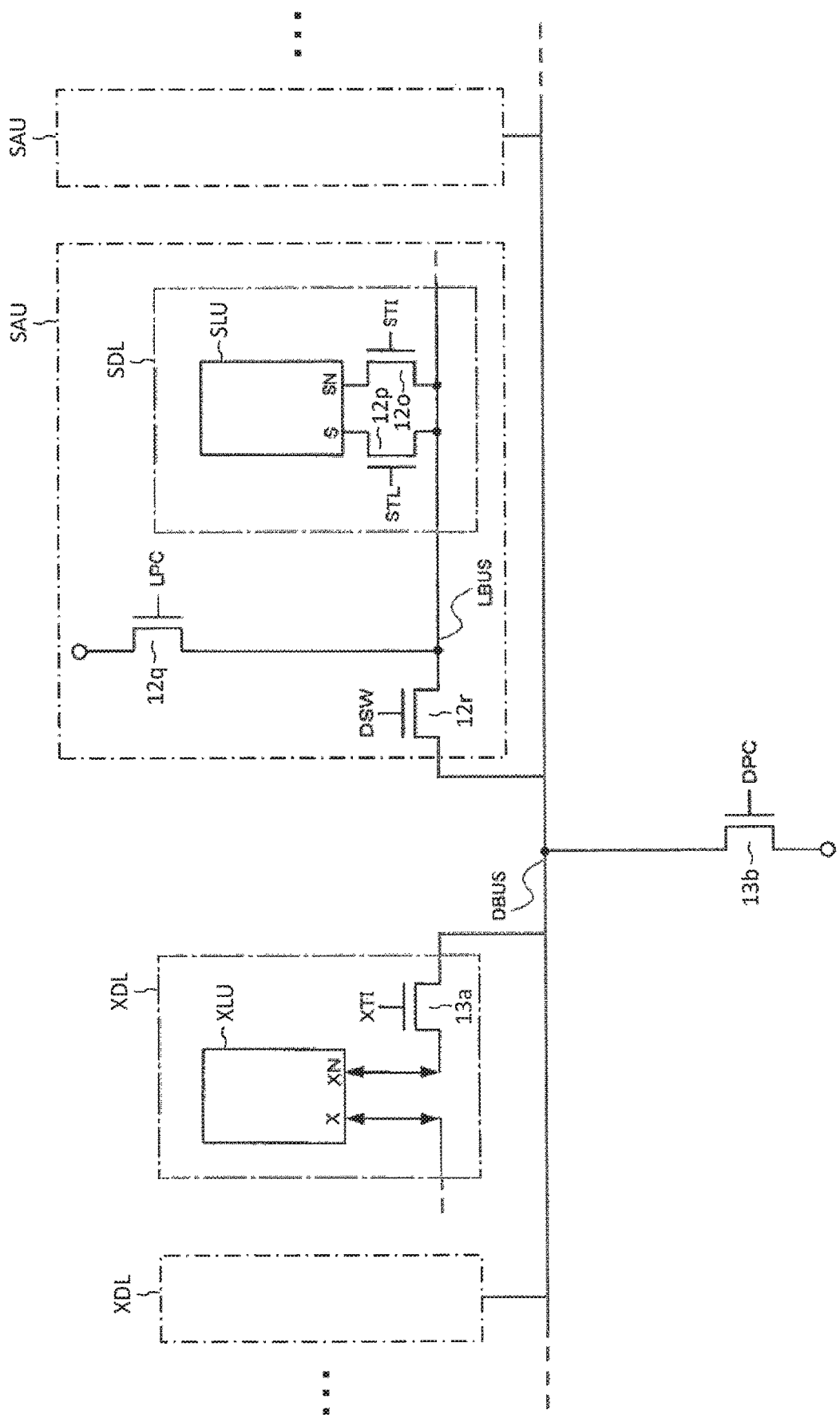
FIG. 18 is a diagram illustrating an example of a circuit configuration related to a data transfer operation between the latch circuit SDL and the latch circuit XDL, in the semiconductor memory device according to the first embodiment.

FIG. 18 is a circuit configuration diagram in which a circuit configuration related to a data transfer operation between the latch circuit SDL and the latch circuit XDL is extracted from the circuit configuration diagram shown in FIG. 6. In FIG. 18, a transistor 13b, which is, for example, an n-channel MOS transistor omitted in FIG. 6, is shown. A first terminal of the transistor 13b is coupled to a voltage source (which is not shown in FIG. 18), and a second terminal of the transistor 13b is coupled to the bus DBUS. A control signal DPC is applied to a gate of the transistor 13b.

The latch circuit SDL shown in FIG. 18 includes a latch portion SLU. The latch portion SLU corresponds to the inverters 12m and 12n coupled to the nodes LAT_S and INV_S shown in FIG. 6. As shown in FIG. 18, the latch portion SLU includes a data terminal S corresponding to the node LAT_S shown in FIG. 6, and an inverted data terminal SN corresponding to the node INV_S shown in FIG. 6 and having an inverted version of the logic of the data terminal S.

The latch circuit XDL shown in FIG. 18 includes a transistor 13a, which is, for example, an n-channel MOS transistor, and a latch portion XLU. The latch portion XLU includes, for example, two inverter circuits configured in such a manner that an input of each of the inverter circuits is coupled to an output of the other inverter circuit, as in the latch portion SLU, and includes a data terminal X corresponding to the data terminal S, and an inverted data terminal XN corresponding to the inverted data terminal SN and having an inverted version of the logic of the data terminal X. A first terminal of the transistor 13a is coupled to the bus DBUS, and a second terminal of the transistor 13a is coupled to the inverted data terminal XN. A control signal XTI is applied to a gate of the transistor 13a.

When the control signal LPC is at H level, the transistor 12q is turned on, allowing the bus LBUS to be precharged. When the control signal DPC is at H level, the transistor 13b is turned on, allowing the bus DBUS to be precharged.

When the control signal STL is at H level, the transistor 12p is turned on, allowing data transfer between the data terminal S of the latch circuit SDL and the bus LBUS. When the control signal STI is at H level, the transistor 12o is turned on, allowing data transfer between the inverted data terminal SN of the latch circuit SDL and the bus LBUS.

When the control signal DSW is at H level, the transistor 12r is turned on, allowing data transfer between the bus LBUS and the bus DBUS. When the control signal XTI is at H level, the transistor 13a is turned on, allowing data transfer between the bus DBUS and the inverted data terminal XN.

The control signals DPC and XTI described above are also generated by, for example, the sequencer 21.

Figure 19:
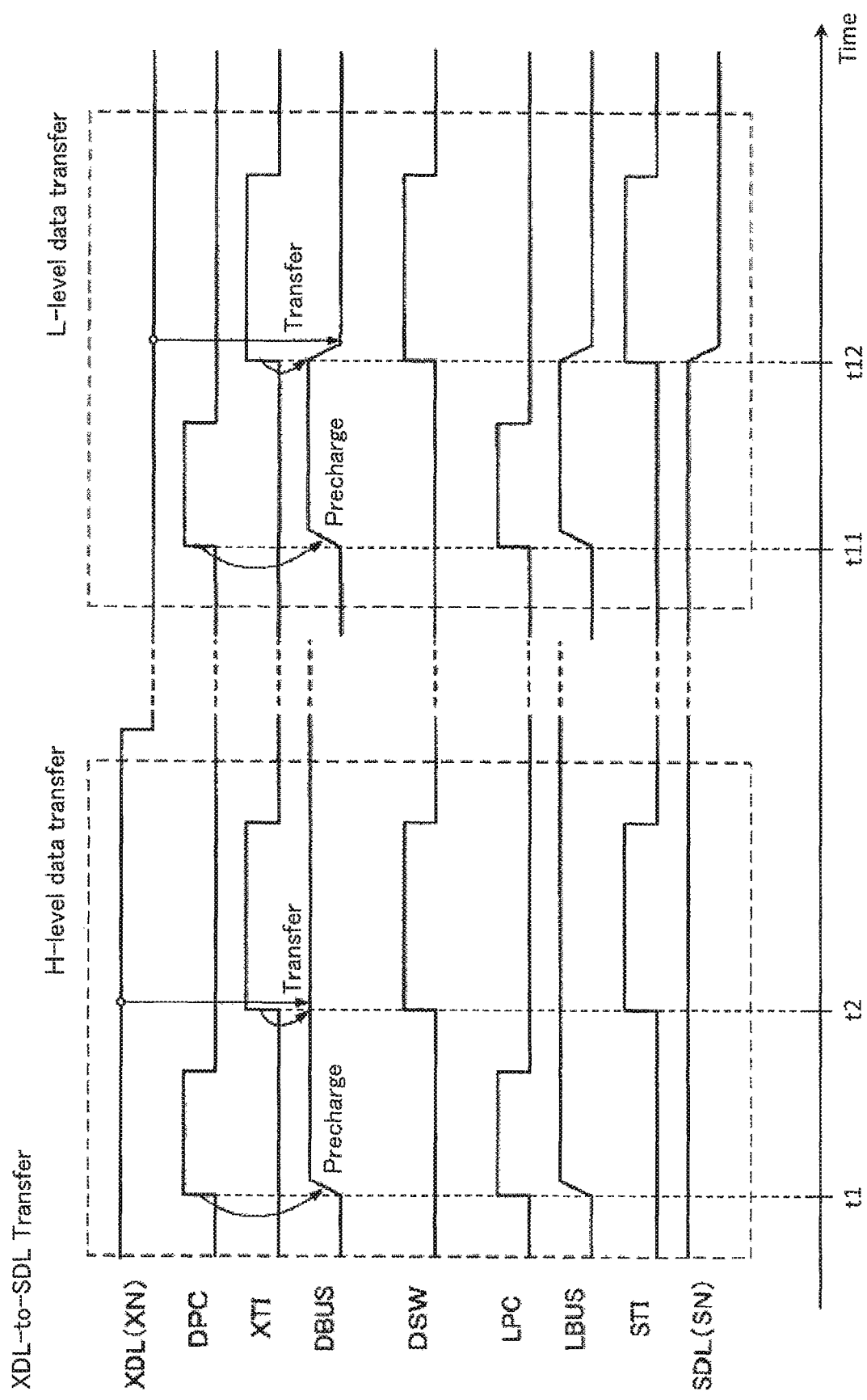
FIG. 19 is a timing chart illustrating an example of temporal changes in voltages of various control signals and voltages applied to various circuit components, in a data transfer operation from a latch circuit XDL to a latch circuit SDL in the semiconductor memory device according to the first embodiment.

FIG. 19 is a timing chart showing an example of temporal changes in voltages of various control signals and voltages applied to various circuit components, in a data transfer operation from the latch circuit XDL to the latch circuit SDL. A data write operation to the latch circuit SDL may be performed at either the data terminal S or the inverted data terminal SN. For example, when data is written to the data terminal S, the data terminal S is preliminarily set to H level, and when data is written to the inverted data terminal SN, the inverted data terminal SN is preliminarily set to H level. FIG. 19 shows a case, as an example, where an L-level data transfer operation is performed after an H-level data transfer operation, as a data write operation to the inverted data terminal SN.

First, the H-level data transfer operation will be described.

At time t1, the control signal DPC is turned to H level, allowing the bus DBUS to be precharged to H level. Thereafter, at time t2, the control signal XTI is turned to H level, allowing the bus DBUS to remain at H level, with the inverted data terminal XN of the latch circuit XDL being at H level.

On the other hand, at time t1, the control signal LPC is turned to H level, allowing the bus LBUS to be precharged to H level. Thereafter, at time t2, the control signal DSW is turned to H level, allowing the bus LBUS to remain at H level, with the bus DBUS being at H level.

Also, at time t2, the control signal STI is turned to H level, allowing the inverted data terminal SN of the latch circuit SDL to remain at preliminarily-set H level, with the bus LBUS being at H level.

Next, the L-level data transfer operation will be described.

At time t11, the control signal DPC is turned to H level, allowing the bus DBUS to be precharged to H level. Thereafter, at time t12, the control signal XTI is turned to H level, allowing the bus DBUS to switch from H level to L level, with the inverted data terminal XN of the latch circuit XDL being at L level.

On the other hand, at time t11, the control signal LPC is turned to H level, allowing the bus LBUS to be precharged to H level. Thereafter, at time t12, the control signal DSW is turned to H level, allowing the bus LBUS to switch from H level to L level, with the bus DBUS to which data is transferred by the control of the control signal XTI being at L level.

At time t12, the control signal STI is turned to H level, allowing the inverted data terminal SN of the latch circuit SDL to switch from preliminarily-set H level to L level, with the bus LBUS being at L level.

By thus controlling the voltages of the control signals DPC, XTI, LPC, DSW, and STI, the data stored in the inverted data terminal XN of the latch circuit XDL is transferred to the inverted data terminal SN of the latch circuit SDL.

Figure 20:
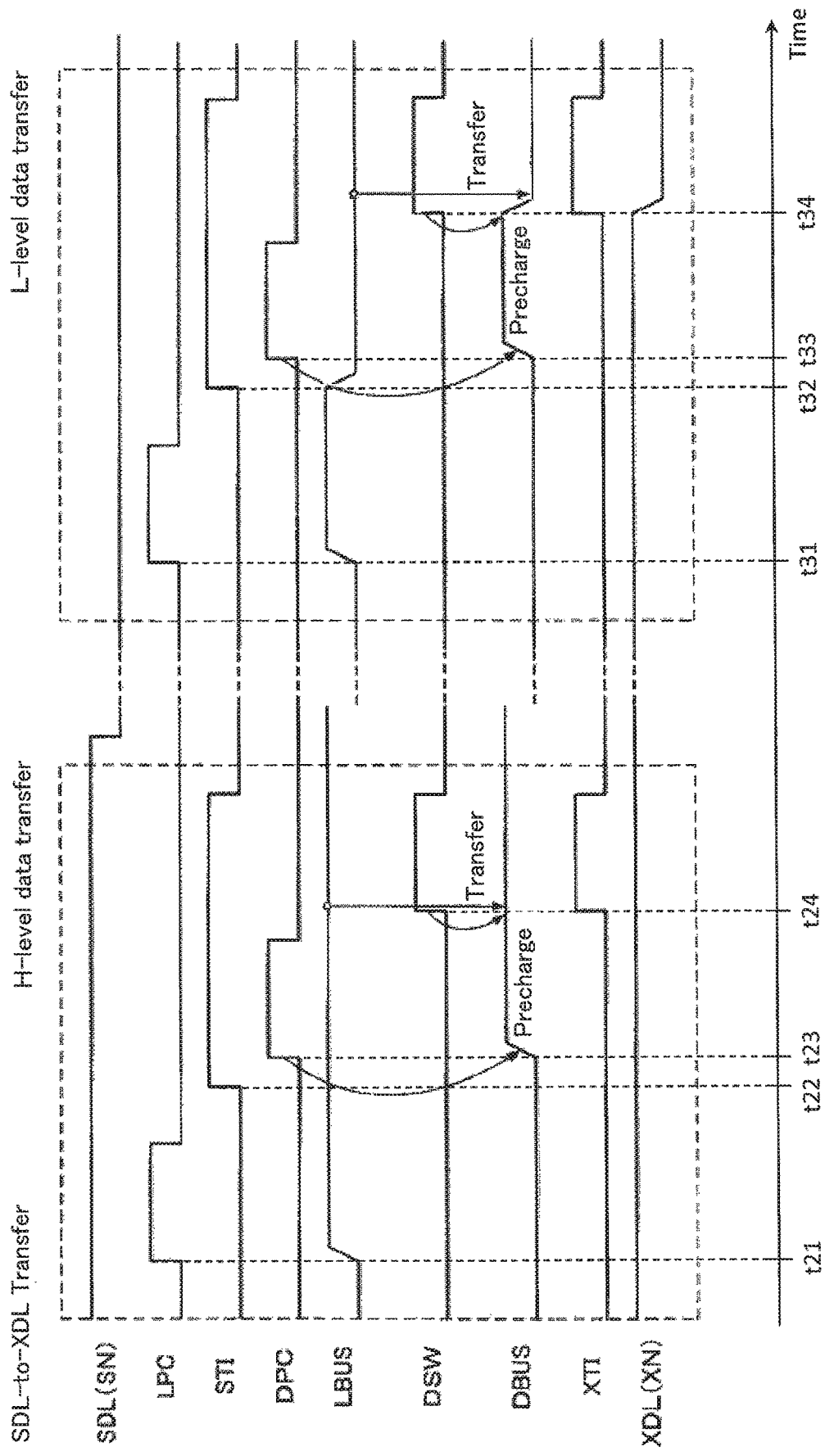
FIG. 20 is a timing chart illustrating an example of temporal changes in voltages of various control signals and voltages applied to various circuit components, in a data transfer operation from a latch circuit SDL to a latch circuit XDL in the semiconductor memory device according to the first embodiment.

FIG. 20 is a timing chart showing an example of temporal changes in voltages of various control signals and voltages applied to various circuit components, in a data transfer operation from the latch circuit SDL to the latch circuit XDL. A data write operation to the latch circuit XDL may be performed at either the data terminal X or the inverted data terminal XN. For example, when data is written to the data terminal X, the data terminal X is preliminarily set to H level, and when data is written to the inverted data terminal XN, the inverted data terminal XN is preliminarily set to H level. FIG. 20 shows a case, as an example, where an L-level data transfer operation is performed after an H-level data transfer operation, as a data write operation to the inverted data terminal XN. In the case shown in FIG. 20, the data stored in the latch circuit SDL is output from the inverted data terminal SN, as an example.

First, the H-level data transfer operation will be described.

At time t21, the control signal LPC is turned to H level, allowing the bus LBUS to be precharged to H level. Thereafter, at time t22, the control signal STI is turned to H level, allowing the bus LBUS to remain at H level, with the inverted data terminal SN of the latch circuit SDL being at H level.

Thereafter, at time t23, the control signal DPC is turned to H level, allowing the bus DBUS to be precharged to H level. Thereafter, at time t24, the control signal DSW is turned to H level, allowing the bus DBUS to remain at H level, with the bus LBUS being at H level.

At time t24, the control signal XTI is turned to H level, allowing the inverted data terminal XN of the latch circuit XDL to remain at preliminarily-set H level, with the bus DBUS being at H level.

Next, the L-level data transfer operation will be described.

At time t31, the control signal LPC is turned to H level, allowing the bus LBUS to be precharged to H level. Thereafter, at time t32, the control signal STI is turned to H level, allowing the bus LBUS to switch from H level to L level, with the inverted data terminal SN of the latch circuit SDL being at L level.

Thereafter, at time t33, the control signal DPC is turned to H level, allowing the bus DBUS to be precharged to H level. Thereafter, at time t34, the control signal DSW is turned to H level, allowing the bus DBUS to switch from H level to L level, with the bus LBUS being at L level.

Also, at time t34, the control signal XTI is turned to H level, allowing the inverted data terminal XN of the latch circuit XDL to switch from preliminarily-set H level to L level, with the bus DBUS being at L level.

By thus controlling the voltages of the control signals LPC, STI, DPC, DSW, and XTI, the data stored in the inverted data terminal SN of the latch circuit SDL is transferred to the inverted data terminal XN of the latch circuit XDL.

Figure 21:
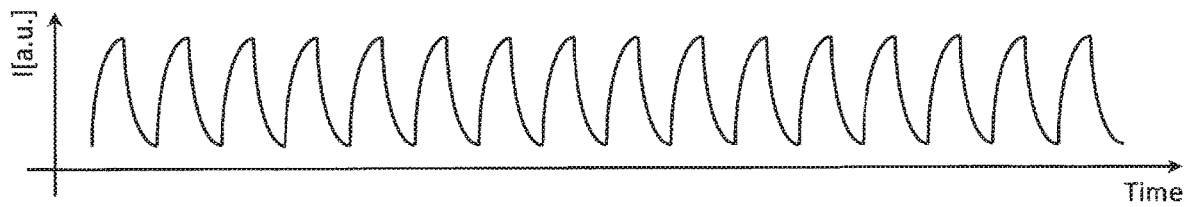
FIG. 21 is a current waveform diagram illustrating an example of data transfer operations from 16 sense amplifier units SAU to 16 latch circuits XDL, in the semiconductor memory device according to the comparative example of the first embodiment.

FIG. 21 is a current waveform diagram illustrating an example of data transfer operations from the 16 sense amplifier units SAU to the 16 latch circuits XDL, in the semiconductor memory device according to the comparative example of the first embodiment shown in FIG. 7. The waveform diagram is obtained by, for example, measuring the consumption currents of the chip including the semiconductor memory device. A similar waveform diagram may be obtained for data transfer operations from the 16 latch circuits XDL to the 16 sense amplifier units SAU. The same applies to FIGS. 22 to 24.

As shown in FIG. 7, in the semiconductor memory device according to the comparative example of the first embodiment, each of the 16 sense amplifier units SAU<0> to SAU<15> is coupled to the corresponding latch circuit XDL, of the latch circuits XDL<0> to XDL<15>, via the same bus cDBUS. Accordingly, when data transfer operations are performed from the 16 sense amplifier units SAU<0> to SAU<15> to the corresponding latch circuits XDL, of the 16 latch circuits XDL<0> to XDL<15>, the data transfer operations from the sense amplifier units SAU are performed one after another. That is, 16 data transfer operations are sequentially performed for the respective sense amplifier units SAU. In the waveform diagram shown in FIG. 21, there are 16 peaks, each of which corresponds to a data transfer operation from one of the sense amplifier units SAU.

Figure 22:
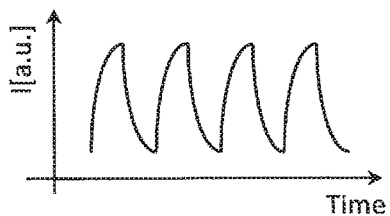
FIG. 22 is a current waveform diagram illustrating an example of data transfer operations from 16 sense amplifier units SAU to 16 latch circuits XDL, in the semiconductor memory device according to the first embodiment.

FIG. 22 is a current waveform diagram showing an example of data transfer operations from the 16 sense amplifier units SAU to the 16 latch circuits XDL, in the semiconductor memory device 1 according to the first embodiment shown in FIG. 8. The waveform diagram is obtained by, for example, measuring the consumption currents of the chip including the semiconductor memory device 1. The vertical axis scale of the current waveform diagram shown in FIG. 22 does not necessarily match that of the current waveform diagram shown in FIG. 21.

As shown in FIG. 8, in the semiconductor memory device 1 according to the first embodiment, each of the four sense amplifier units SAU<0> to SAU<3> is coupled to the corresponding latch circuit XDL, of the four latch circuits XDL<0> to XDL<3>, via the same bus DBUS0. Each of the four sense amplifier units SAU<4> to SAU<7> is coupled to the corresponding latch circuit XDL, of the four latch circuits XDL<4> to XDL<7>, via the same bus DBUS1. Each of the four sense amplifier units SAU<8> to SAU<11> is coupled to the corresponding latch circuit XDL, of the four latch circuits XDL<8> to XDL<11>, via the same bus DBUS2. Each of the four sense amplifier units SAU<12> to SAU<15> is coupled to the corresponding latch circuit XDL, of the four latch circuits XDL<12> to XDL<15>, via the same bus DBUS3.

Accordingly, when data transfer operations are performed from the four sense amplifier units SAU coupled to the same bus, of the buses DBUS0, DBUS1, DBUS2, and DBUS3, to the corresponding latch circuits XDL, the data transfer operations from the sense amplifier units SAU are performed one after another. That is, four data transfer operations are sequentially performed for the respective sense amplifier units SAU, with respect to each of the buses DBUS0, DBUS1, DBUS2, and DBUS3.

In the waveform diagram shown in FIG. 22, there are four peaks. Of the four peaks, for example, the first peak corresponds to a data transfer operation from the first sense amplifier unit SAU via each of the buses DBUS0, DBUS1, DBUS2, and DBUS3. Of the four peaks, the second peak corresponds to a data transfer operation from the second sense amplifier unit SAU via each of the buses DBUS0, DBUS1, DBUS2, and DBUS3. Of the four peaks, the third peak corresponds to a data transfer operation from the third sense amplifier unit SAU via each of the buses DBUS0, DBUS1, DBUS2, and DBUS3. Of the four peaks, the fourth peak corresponds to a data transfer operation from the fourth sense amplifier unit SAU via each of the buses DBUS0, DBUS1, DBUS2, and DBUS3.

Advantageous Effects

In the semiconductor memory device according to the comparative example of the first embodiment, 16 sense amplifier units SAU<0> to SAU<15> are commonly coupled to one bus cDBUS, and 16 latch circuits XDL<0> to XDL<15>, corresponding one to one to the sense amplifier units SAU<0> to SAU<15>, are commonly coupled to the bus cDBUS, as described with reference to FIGS. 10 and 16. That is, each of the 16 sense amplifier units SAU<0> to SAU<15> is coupled to the corresponding latch circuit XDL via the same bus cDBUS. Such a configuration, in which a larger number of sense amplifier units SAU and latch circuits XDL are coupled via the same bus, is often adopted in an effort to advance miniaturization of a semiconductor memory device. Such a bus is used as, for example, a data transfer path, and a larger number of sense amplifier units SAU and latch circuits XDL share the data transfer path.

Thus, in the semiconductor memory device according to the comparative example, when data transfer operations are performed from the 16 sense amplifier units SAU<0> to SAU<15> to the corresponding latch circuits XDL, of the 16 latch circuits XDL<0> to XDL<15>, for example, data transfer operations from the sense amplifier units SAU are performed one after another, as described with reference to FIG. 21. That is, 16 data transfer operations are sequentially performed for the respective sense amplifier units SAU. In such data transfer operations, the time taken from when the first sense amplifier unit SAU starts data transfer until the last sense amplifier unit SAU completes data transfer increases, as the number of sense amplifier units SAU that use the same bus as the data transfer path increases.

On the other hand, in the semiconductor memory device 1 according to the first embodiment, sense amplifier units SAU of a number less than 16, e.g., four sense amplifier units SAU<0> to SAU<3> are commonly coupled to one bus DBUS0, and four latch circuits XDL<0> to XDL<3>, corresponding one to one to the sense amplifier units SAU<0> to SAU<3>, are commonly coupled to the bus DBUS0. That is, each of the four sense amplifier units SAU<0> to SAU<3> is coupled to the corresponding latch circuit XDL via the same bus DBUS0. Similarly, each of the four sense amplifier units SAU<4> to SAU<7> is coupled to the corresponding latch circuit XDL via the same bus DBUS1. Similarly, each of the four sense amplifier units SAU<8> to SAU<11> is coupled to the corresponding latch circuit XDL via the same bus DBUS2. Similarly, each of the four sense amplifier units SAU<12> to SAU<15> is coupled to the corresponding latch circuit XDL via the same bus DBUS3.

In this manner, the number of sense amplifier units SAU that use the same bus as a data transfer path in the semiconductor memory device 1 according to the first embodiment is less than that of the semiconductor memory device according to the comparative example of the first embodiment. In the semiconductor memory device 1 according to the first embodiment, it is possible to perform a data transfer operation between the 16 sense amplifier units SAU<0> to SAU<15> and the 16 latch circuits XDL<0> to XDL<15> in parallel, by means of four buses DBUS0 to DBUS3. That is, four data transfer operations are sequentially performed for the respective sense amplifier units SAU, with respect to each of the buses DBUS0 to DBUS3. This means that the speed of data transfer is quadrupled, as compared to the semiconductor memory device according to the comparative example of the first embodiment. Therefore, according to the semiconductor memory device 1 of the first embodiment, it is possible to increase the speed of data transfer between the sense amplifier module 12 and the data register 13.

Moreover, according to the semiconductor memory device 1 of the first embodiment, by providing the interconnects ML4, it is possible to connect, for example, the interconnect rBLI<1>, corresponding to the bus DBUS0, in parallel to the interconnects rBLI adjacent thereto, as described with reference to FIG. 14. By such parallel connection, it is possible to reduce the resistance value of the bus DBUS0. By thus reducing the resistance values of the buses DBUS0 to DBUS3, it is possible in the semiconductor memory device 1 according to the first embodiment to further increase the speed of data transfer.

In the semiconductor memory device 1 according to the first embodiment, when an operation is executed by, for example, a logical operation circuit coupled to the bus LBUS, via the above-described bus as a data transfer path, it is possible to increase the speed of data transfer to and from the operation circuit via the bus LBUS, as compared to the semiconductor memory device of the comparative example of the first embodiment.

The bus cDBUS in the semiconductor memory device according to the comparative example of the first embodiment is provided in the metal interconnect layer L0 in a region in which the sense amplifier module is located, as described with reference to FIG. 10. On the other hand, the buses DBUS0 to DBUS3 in the semiconductor memory device 1 according to the first embodiment are provided in the metal interconnect layer L1, in addition to the metal interconnect layer L0, in a region in which the sense amplifier module 12 is located, as described with reference to FIG. 11. For example, the bus DBUS0 corresponds to the bus DBUS0-1 and the interconnect ML0 in the metal interconnect layer L0 and the interconnect rBLI<1> in the metal interconnect layer L1 shown in FIG. 11. Similarly, the bus DBUS1 corresponds to the bus DBUS1-1 and the interconnect ML1 in the metal interconnect layer L0 and the interconnect rBLI<5> in the metal interconnect layer L1 shown in FIG. 11. Similarly, the bus DBUS2 corresponds to the bus DBUS2-1 and the interconnect ML2 in the metal interconnect layer L0 and the interconnect rBLI<9> in the metal interconnect layer L1 shown in FIG. 11. Similarly, the bus DBUS3 corresponds to the bus DBUS3-1 and the interconnect ML3 in the metal interconnect layer L0 and the interconnect rBLI<13> in the metal interconnect layer L1 shown in FIG. 11.

As described with reference to FIG. 11, the interconnects rBLI<1>, rBLI<5>, rBLI<9>, and rBLI<13> can be formed by, for example, dividing interconnects (for example, interconnects cBLI in FIG. 10.) in the metal interconnect layer L1. More specifically, each of the interconnects rBLI<1>, rBLI<5>, rBLI<9>, and rBLI<13> may be formed by, for example, dividing a plurality of interconnects including the corresponding interconnect in the metal interconnect layer L1 at once, instead of dividing only the corresponding interconnect as described with reference to FIG. 11. On the other hand, the buses DBUS0-1, DBUS1-1, DBUS2-1, and DBUS3-1 may be formed by, for example, dividing an interconnect (for example, the bus cDBUS in FIG. 10.) in the metal interconnect layer L0. The interconnect ML0 may be formed, for example, in the metal interconnect layer L0 integrally with the bus DBUS0-1 in the shape of a crank. Similarly, the interconnect ML1 may be formed integrally with the bus DBUS1-1 in the shape of a crank, the interconnect ML2 may be formed integrally with the bus DBUS2-1 in the shape of a crank, and the interconnect ML3 may be formed integrally with the bus DBUS3-1 in the shape of a crank. Such formation of the interconnects ML0, ML1, ML2, and ML3 in the metal interconnect layer L0 is made possible by configuring the width of the interconnects in the metal interconnect layer L0 to be greater than the width of the interconnects in the metal interconnect layer L1 in the region in which the sense amplifier module 12 is located, as described with reference to FIG. 12.

By using the interconnects and the buses formed in the above-described manner, it is possible in the semiconductor memory device 1 according to the first embodiment to provide the above-described buses DBUS0, DBUS1, DBUS2, and DBUS3. It is thus possible in the semiconductor memory device 1 according to the first embodiment to ease restrictions placed on the interconnect layers when, for example, miniaturization of the semiconductor memory device is advanced.

[Modifications]

A detailed description has been given above with respect to the relationship of coupling between the 16 sense amplifier units SAU<0> to SAU<15> and the 16 latch circuits XDL<0> to XDL<15>, corresponding one to one to the sense amplifier units SAU<0> to SAU<15>. However, the relationship of coupling between the sense amplifier units SAU<0> to SAU<15> and the latch circuits XDL<0> to XDL<15> in the semiconductor memory device 1 according to the first embodiment is not limited to the above-described one.

A description will be made, with reference to current waveform diagrams, on an example of data transfer operations from 16 sense amplifier units SAU to 16 latch circuits XDL, in a semiconductor memory device 1 according to a first modification and a second modification of the first embodiment. The vertical axis scale of the current waveform diagram shown in each of FIGS. 23 and 24 does not necessarily match that of the current waveform diagrams shown in FIGS. 21 and 22.

A description will also be made on an example of a layout of sense amplifier units SAU<0> to SAU<15> and buses DBUS0, DBUS1, DBUS2, and DBUS3 in a semiconductor memory device 1 according to a third modification of the first embodiment.

(1) First Modification

Figure 23:
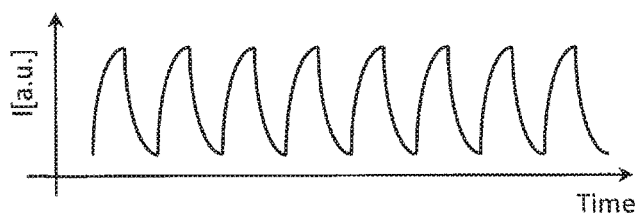
FIG. 23 is a current waveform diagram illustrating an example of data transfer operations from 16 sense amplifier units SAU to 16 latch circuits XDL, in a semiconductor memory device according to a first modification of the first embodiment.

FIG. 23 is a current waveform diagram showing an example of data transfer operations from 16 sense amplifier units SAU to 16 latch circuits XDL, in the semiconductor memory device 1 according to the first modification of the first embodiment.

In the first modification, for example, each of the eight sense amplifier units SAU<0> to SAU<7> is coupled to the corresponding latch circuit XDL, of the eight latch circuits XDL<0> to XDL<7>, via the same bus mDBUS0. Each of the eight sense amplifier units SAU<8> to SAU<15> is coupled to the corresponding latch circuit XDL, of eight latch circuits XDL<8> to XDL<15>, via the same bus mDBUS1.

Accordingly, when data transfer operations are performed from the eight sense amplifier units SAU coupled to the same bus, of the buses mDBUS0 and mDBUS1, to the corresponding latch circuits XDL, the data transfer operations from the sense amplifier units SAU are performed one after another. That is, eight data transfer operations are sequentially performed for the respective sense amplifier units SAU, with respect to each of the buses mDBUS0 and mDBUS1.

In the waveform diagram shown in FIG. 23, there are eight peaks. Of the eight peaks, for example, the first peak corresponds to a data transfer operation from the first sense amplifier unit SAU via each of the buses mDBUS0 and mDBUS1. Of the eight peaks, the second peak corresponds to a data transfer operation from the second sense amplifier unit SAU via each of the buses mDBUS0 and mDBUS1. The same applies to the third to eighth peaks.

(2) Second Modification

Figure 24:
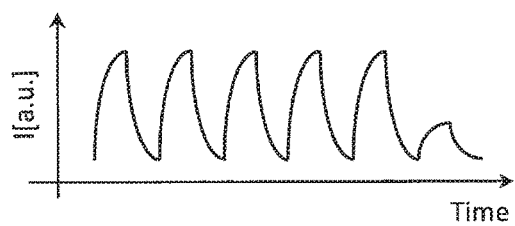
FIG. 24 is a current waveform diagram illustrating an example of data transfer operations from 16 sense amplifier units SAU to 16 latch circuits XDL, in a semiconductor memory device according to a second modification of the first embodiment.

FIG. 24 is a current waveform diagram illustrating an example of data transfer operations from 16 sense amplifier units SAU to 16 latch circuits XDL, in a semiconductor memory device according to a second modification of the first embodiment.

In the second modification, for example, each of the six sense amplifier units SAU<0> to SAU<5> is coupled to the corresponding latch circuit XDL, of the six latch circuits XDL<0> to XDL<5>, via the same bus mDBUS2. Each of the five sense amplifier units SAU<6> to SAU<10> is coupled to the corresponding latch circuit XDL, of the five latch circuits XDL<6> to XDL<10>, via the same bus mDBUS3. Each of the five sense amplifier units SAU<11> to SAU<15> is coupled to the corresponding latch circuit XDL, of the five latch circuits XDL<11> to XDL<15>, via the same bus mDBUS4.

Accordingly, when data transfer operations are performed from the sense amplifier units SAU coupled to the same bus, of the buses mDBUS2, mDBUS3, and mDBUS4, to the corresponding latch circuits XDL, the data transfer operations from the sense amplifier units SAU are performed one after another. That is, six data transfer operations are sequentially performed for the respective sense amplifier units SAU with respect to the bus mDBUS2, and five data transfer operations are sequentially performed for the respective sense amplifier units SAU with respect to each of the buses mDBUS3 and mDBUS4.

In the waveform diagram shown in FIG. 24, there are six peaks. The height of the sixth peak is approximately one third of the heights of the first to fifth peaks. For example, the first peak corresponds to a data transfer operation from the first sense amplifier unit SAU via each of the buses mDBUS2, mDBUS3, and mDBUS4. The second peak corresponds to a data transfer operation from the second sense amplifier unit SAU via each of the buses mDBUS2, mDBUS3, and mDBUS4. The same applies to the third to fifth peaks. The sixth peak corresponds to a data transfer operation from the sixth sense amplifier unit SAU via the bus mDBUS2.

(3) Third Modification

Figure 25:
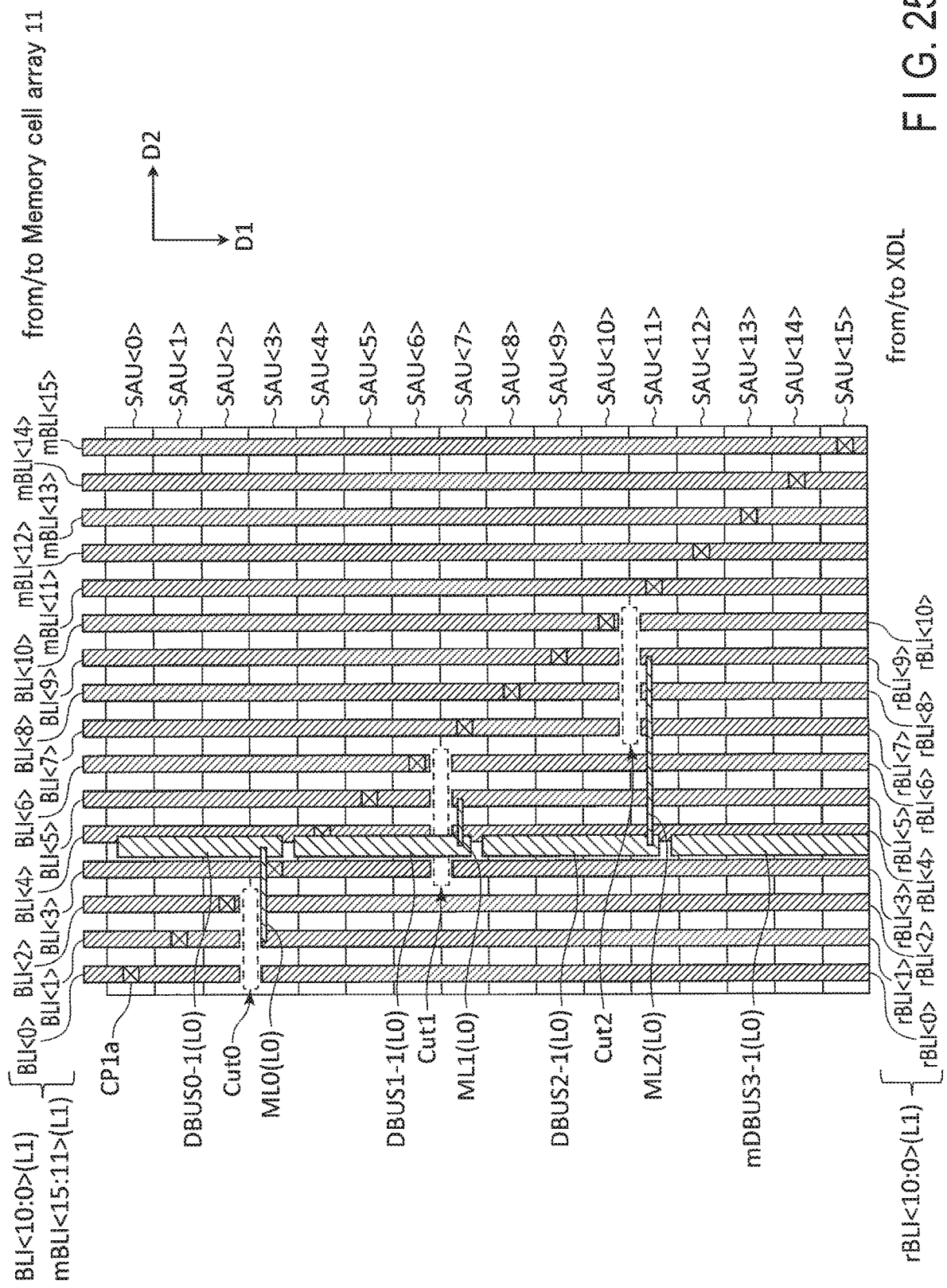
FIG. 25 is a diagram illustrating an example of a layout of sense amplifier units SAU and buses DBUS, in a semiconductor memory device according to a third modification of the first embodiment.

FIG. 25 is a diagram illustrating an example of a layout of the sense amplifier units SAU<0> to SAU<15> and the buses DBUS0, DBUS1, DBUS2, and DBUS3, in the semiconductor memory device 1 according to the third modification of the first embodiment. Hereinafter, the description will focus mainly on the matters different from the layout shown in FIG. 11.

The example shown in FIG. 25 is similar to the example shown in FIG. 11, except that the interconnects mBLI<11> to mBLI<15> are provided instead of the interconnects BLI<11> to BLI<15> and the interconnects rBLI<11> to rBLI<14> shown in FIG. 11, that the bus mDBUS3-1 is provided instead of the bus DBUS3-1 shown in FIG. 11, and that the interconnect ML3 shown in FIG. 11 is not provided. The interconnect mBLI<k> corresponds to the sense amplifier unit SAU<k>, where k represents an integer of one of 11 to 15.

The interconnects mBLI<11> to mBLI<15> are similar to the interconnects BLI<11> to BLI<15> described with reference to FIG. 11, except that each of the interconnects mBLI<11> to mBLI<15> extends, for example, along the first direction D1 in the metal interconnect layer L1, at least from a region above the sense amplifier unit SAU<0> to a region above the sense amplifier unit SAU<15>.

The bus mDBUS3-1 is similar to the bus DBUS3-1 described with reference to FIG. 11, except that the bus mDBUS3-1 extends, for example, along the first direction D1 in the metal interconnect layer L0, at least from a region above the sense amplifier unit SAU<12> toward the latch circuits XDL through a region above the sense amplifier unit SAU<15>.

Each of the interconnects mBLI<11> to mBLI<15> is connected to the corresponding sense amplifier unit SAU, of the sense amplifier units SAU<11> to SAU<15>, in a manner similar to the interconnects BLI<11> to BLI<15> described with reference to FIG. 11.

As described with reference to FIG. 11, the sense amplifier unit SAU<11> is connected to the bus DBUS2-1, and the bus DBUS2-1 is connected to the interconnect rBLI<9> via the interconnect ML2.

Each of the sense amplifier units SAU<12> to SAU<15> is connected to the bus mDBUS3-1, in a manner similar to the connection to the bus DBUS3-1 described with reference to FIG. 11. The bus mDBUS3-1 corresponds to the bus DBUS3 shown in FIG. 8.

The bus mDBUS3-1, which leads from the latch circuits XDL through a region above the sense amplifier unit SAU<15>, extends along the first direction D1 in the metal interconnect layer L1, at least from a region above the latch circuit XDL<0> to a region above the latch circuit XDL<15>, in a manner similar to the bus cDBUS described with reference to FIG. 16. The bus mDBUS3-1 is connected to each of the latch circuits XDL<12> to XDL<15>, in a manner similar to the bus cDBUS described with reference to FIG. 16.

In the description given above, a case has been described where the interconnects mBLI<11> to mBLI<15> are provided, instead of the interconnects BLI<11> to BLI<15> and the interconnects rBLI<11> to rBLI<14> shown in FIG. 11. However, the interconnects BLI<11> to BLI<15> and the interconnects rBLI<11> to rBLI<14> may be provided, instead of the interconnects mBLI<11> to mBLI<15>. In this case, each of the interconnects BLI<11> to BLI<15> is connected to the corresponding sense amplifier unit SAU, of the sense amplifier units SAU<11> to SAU<15>, in a manner similar to the configuration described with reference to FIG. 11.

Other Embodiments

In the specification of the present application, the term "couple" refers to electrical coupling, and does not exclude intervention of another component.

Moreover, the names such as "sense amplifier module", "sense amplifier unit", "sense amplifier circuit", and "data register" used throughout the specification and the combinations of components described as being included therein are adopted merely for convenience in describing the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device, comprising:
   a first memory cell;

a first interconnect coupled to the first memory cell, the first interconnect extending in a first direction in a first interconnect layer, and having a first end surface crossing the first direction;
a first sense amplifier coupled to the first interconnect;
a second interconnect coupled to the first sense amplifier, the second interconnect extending in the first direction in the first interconnect layer, and having a second end surface crossing the first direction; and
a first latch circuit coupled to the second interconnect,
wherein the first end surface is opposed to the second end surface.

2. The device of claim 1, further comprising:
a third interconnect in a second interconnect layer, the second interconnect layer being at a position different from the first interconnect layer when viewed in a stacking direction,
wherein the first sense amplifier and the second interconnect being are coupled via the third interconnect.

3. The device of claim 2, wherein:
the third interconnect extends in the first direction;
the semiconductor memory device further comprises, in the second interconnect layer, a fourth interconnect extending in a second direction, the second direction crossing the first direction; and
the second interconnect and the third interconnect are coupled via the fourth interconnect.

4. The device of claim 3, further comprising:
a fifth sense amplifier;
a tenth interconnect coupled to the fifth sense amplifier and extending in the first direction in the second interconnect layer; and
a fifth latch circuit coupled to the tenth interconnect, without intervention of an interconnect extending in the second direction in the second interconnect layer.

5. The device of claim 2, wherein a width of the third interconnect is greater than a width of the first interconnect.

6. The device of claim 2, further comprising:
a fourth sense amplifier;
a ninth interconnect coupled to the fourth sense amplifier, the ninth interconnect extending in the first direction in the second interconnect layer, and having a seventh end surface crossing the first direction; and
a fourth latch circuit coupled to the ninth interconnect,
wherein the third interconnect extends in the first direction and has an eighth end surface crossing the first direction, and
wherein the eighth end surface is opposed to the seventh end surface.

7. The device of claim 6, wherein a width of the third interconnect is equal to a width of the ninth interconnect.

8. The device of claim 1, wherein a width of the first interconnect is equal to a width of the second interconnect.

9. The device of claim 1, further comprising:
a shield interconnect for the second interconnect.

10. The device of claim 1, further comprising:
an interconnect coupled in parallel to the second interconnect.

11. The device of claim 10, further comprising:
a shield interconnect for the second interconnect.

12. The device of claim 1, further comprising:
a second memory cell;
a fifth interconnect coupled to the second memory cell and extending in the first direction in the first interconnect layer;
a second sense amplifier coupled to the fifth interconnect; and
a second latch circuit coupled to the second sense amplifier via the second interconnect.

13. The device of claim 12, further comprising:
a third interconnect in a second interconnect layer, the second interconnect layer being at a position different from the first interconnect layer when viewed in a stacking direction,
wherein the first sense amplifier and the second interconnect are coupled via the third interconnect, and
wherein the second sense amplifier and the second interconnect are coupled via the third interconnect.

14. The device of claim 12, wherein:
the fifth interconnect has a third end surface crossing the first direction; and
the third end surface and the first end surface are aligned along a second direction, the second direction crossing the first direction.

15. The device of claim 12, further comprising:
a sixth interconnect extending in the first direction in the first interconnect layer and having a fourth end surface crossing the first direction,
wherein the fifth interconnect has a third end surface crossing the first direction,
wherein the third end surface is opposed to the fourth end surface, and
wherein the sixth interconnect is a shield interconnect.

16. The device of claim 15, wherein the fourth end surface and the second end surface are aligned along a second direction, the second direction crossing the first direction.

17. The device of claim 12, further comprising:
a sixth interconnect extending in the first direction in the first interconnect layer and having a fourth end surface crossing the first direction,
wherein the fifth interconnect has a third end surface crossing the first direction,
wherein the third end surface is opposed to the fourth end surface, and
wherein the second interconnect and the sixth interconnect being are coupled in parallel.

18. The device of claim 17, wherein the fourth end surface and the second end surface are aligned along a second direction, the second direction crossing the first direction.

19. The device of claim 17, further comprising:
a third memory cell;
a seventh interconnect coupled to the third memory cell, the seventh interconnect extending in the first direction in the first interconnect layer, and having a fifth end surface crossing the first direction;
a third sense amplifier coupled to the seventh interconnect;
a third latch circuit coupled to the third sense amplifier via the second interconnect; and
an eighth interconnect extending in the first direction in the first interconnect layer and having a sixth end surface crossing the first direction,
wherein the fifth end surface is opposed to the sixth end surface, and
wherein the eighth interconnect is a shield interconnect.

* * * * *